(12) United States Patent
Lee et al.

(10) Patent No.: US 11,930,659 B2
(45) Date of Patent: Mar. 12, 2024

(54) DISPLAY PANEL

(71) Applicant: SAMSUNG DISPLAY CO., LTD., Yongin-si (KR)

(72) Inventors: Jeongho Lee, Yongin-si (KR); Swaehyun Kim, Yongin-si (KR); Hun Kim, Yongin-si (KR); Youhan Moon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 236 days.

(21) Appl. No.: 17/407,455

(22) Filed: Aug. 20, 2021

(65) Prior Publication Data

US 2022/0199946 A1 Jun. 23, 2022

(30) Foreign Application Priority Data

Dec. 17, 2020 (KR) ........................ 10-2020-0177818

(51) Int. Cl.
*H01L 51/52* (2006.01)
*H01L 27/12* (2006.01)
*H01L 27/32* (2006.01)
*H01L 29/786* (2006.01)
(Continued)

(52) U.S. Cl.
CPC ......... *H10K 50/844* (2023.02); *H01L 27/124* (2013.01); *H01L 29/7869* (2013.01); *H10K 59/1213* (2023.02)

(58) Field of Classification Search
CPC ... H01L 27/124; H01L 27/12; H01L 27/1225; H01L 27/1218; H01L 27/1248; H01L 29/7869; H01L 29/66742; H01L 29/78618; H10K 50/844; H10K 50/84; H10K 50/8445; H10K 50/8426; H10K 59/1213; H10K 59/121; H10K 59/124; H10K 59/12;
(Continued)

(56) References Cited

U.S. PATENT DOCUMENTS

| 9,905,629 B2 | 2/2018 | Kim et al. |
| 10,135,010 B2 | 11/2018 | Kim et al. |
| 10,135,025 B2 | 11/2018 | Kim et al. |

(Continued)

FOREIGN PATENT DOCUMENTS

| KR | 1020170045459 A | 4/2017 |
| KR | 1020170096646 A | 8/2017 |

(Continued)

*Primary Examiner* — Nikolay K Yushin
(74) *Attorney, Agent, or Firm* — CANTOR COLBURN LLP

(57) ABSTRACT

A display panel includes: a substrate defining an opening therein; a plurality of light-emitting diodes in a display area surrounding the opening; an encapsulation layer on the plurality of light-emitting diodes, the encapsulation layer including at least one inorganic encapsulation layer and at least one organic encapsulation layer; a first partition wall and a second partition wall in a non-display area between the opening and the display area in a direction from the display area to the opening; and a plurality of grooves defined above the at least one inorganic insulating layer in the non-display area. The at least one inorganic insulating layer is on the substrate. At least one of the plurality of grooves is defined between the first partition wall and the second partition wall and is covered with the organic encapsulation layer.

25 Claims, 16 Drawing Sheets

(51) Int. Cl.
*H10K 50/844* (2023.01)
*H10K 59/121* (2023.01)

(58) Field of Classification Search
CPC ...... H10K 59/40; H10K 59/131; H10K 59/00; H10K 59/88
See application file for complete search history.

(56) References Cited

U.S. PATENT DOCUMENTS

| | | | |
|---|---|---|---|
| 10,199,448 B2 | 2/2019 | Kim et al. | |
| 10,466,822 B2 | 11/2019 | Kim et al. | |
| 10,672,802 B2 * | 6/2020 | Lee | H01L 27/124 |
| 11,004,915 B2 * | 5/2021 | Byun | H10K 59/131 |
| 2017/0110532 A1 * | 4/2017 | Kim | H10K 59/12 |
| 2019/0006442 A1 * | 1/2019 | Byun | H10K 59/124 |
| 2019/0164995 A1 * | 5/2019 | Lee | H10K 77/111 |
| 2020/0303478 A1 | 9/2020 | Lee et al. | |
| 2020/0303677 A1 | 9/2020 | Lee et al. | |
| 2020/0403050 A1 | 12/2020 | Seon et al. | |
| 2021/0233474 A1 | 7/2021 | Lee et al. | |

FOREIGN PATENT DOCUMENTS

| | | |
|---|---|---|
| KR | 1020170115177 A | 10/2017 |
| KR | 1020180002126 A | 1/2018 |
| KR | 1020180063633 A | 6/2018 |
| KR | 1020200113092 A | 10/2020 |
| KR | 1020200145902 A | 12/2020 |

* cited by examiner

DISPLAY PANEL

This application claims priority to Korean Patent Application No. 10-2020-0177818, filed on Dec. 17, 2020, and all the benefits accruing therefrom under 35 U.S.C. § 119, the content of which in its entirety is herein incorporated by reference.

BACKGROUND

1. Field

One or more embodiments relate to a display panel having an opening area inside a display area.

2. Description of the Related Art

The usage of a display apparatus has diversified. Also, the display apparatus has become thinner and more lightweight, and thus, the use of the display apparatus has expanded.

While increasing the area occupied by a display area in the display apparatus, various functions have been connected or linked to the display apparatus in order to increase the area and add various functions, studies have been conducted into the display apparatus that enables various components to be arranged in a display area.

SUMMARY

One or more embodiments include a display panel defining an opening area that enables various types of components to be arranged in a display area, and a display apparatus including the display panel. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display panel includes a substrate defining an opening therein; a plurality of light-emitting diodes in a display area surrounding the opening; an encapsulation layer on the plurality of light-emitting diodes, where the encapsulation layer includes at least one inorganic encapsulation layer and at least one organic encapsulation layer; a first partition wall and a second partition wall in a non-display area between the opening and the display area, where the first partition wall and the second partition wall are arranged in a direction from the display area to the opening; and a plurality of grooves defined above the at least one inorganic insulating layer in the non-display area, where the at least one inorganic insulating layer is on the substrate. At least one of the plurality of grooves is defined between the first partition wall and the second partition wall and is covered with the organic encapsulation layer.

A lower layer may be below each of the plurality of grooves, and an upper surface of the lower layer may correspond to a bottom surface of each of the plurality of grooves.

Each of the plurality of light-emitting diodes may be connected to a sub-pixel circuit on the substrate, and the sub-pixel circuit may include a thin-film transistor including a silicon-based semiconductor layer and a thin-film transistor including an oxide-based semiconductor layer.

The lower layer may include the same material as a material of the oxide-based semiconductor layer.

The plurality of grooves may include two or more grooves between the first partition wall and the second partition wall, a first groove adjacent to the first partition wall among the two or more grooves may include a pair of tips protruding toward a center of the first groove and overlapping the organic encapsulation layer in a plan view, and a second groove adjacent to the second partition wall among the two or more grooves may not include a tip on at least one of opposite sides of a virtual vertical line passing through a center of the second groove.

The plurality of light-emitting diodes may include an emission layer between a first electrode and a second electrode, and a functional layer between the first electrode and the second electrode, each of the functional layer and the second electrode may extend to the non-display area and be disconnected or separated by the pair of tips of the first groove in the non-display area.

The functional layer and the second electrode may continuously extend along an inner surface of the second groove.

The first partition wall may include a plurality of protrusions and a recess between adjacent protrusions among the plurality of protrusions.

A portion of the organic encapsulation layer may be in the recess.

The at least one inorganic encapsulation layer may include a first inorganic encapsulation layer below the organic encapsulation layer, and a second inorganic encapsulation layer above the organic encapsulation layer, and a first portion of the first inorganic encapsulation layer and a first portion of the second inorganic encapsulation layer may be in direct contact with each other on one of the plurality of protrusions of the first partition wall.

A second portion of the first inorganic encapsulation layer and a second portion of the second inorganic encapsulation layer may be in direct contact with each other on the second partition wall.

The display panel may further include a metal dummy stack on opposite sides of a virtual vertical line passing through a center of each of the plurality of grooves, and the metal dummy stack may include a plurality of metal layers stacked with an insulating layer therebetween.

According to one or more embodiments, a display panel includes a substrate defining an opening therein; a plurality of light-emitting diodes in a display area surrounding the opening; an encapsulation layer on the plurality of light-emitting diodes, where the encapsulation layer includes an organic encapsulation layer, a first inorganic encapsulation layer below the organic encapsulation layer, and a second inorganic encapsulation layer above the organic encapsulation layer; a plurality of grooves defined in a non-display area between the opening and the display area; and a plurality of lower layers each disposed below each of the plurality of grooves in the non-display area. An upper surface of each of the plurality of lower layers corresponds to a bottom surface of each of the plurality of grooves.

Each of the plurality of light-emitting diodes may be connected to a sub-pixel circuit on the substrate, and the sub-pixel circuit may include a thin-film transistor including a silicon-based semiconductor layer and a thin-film transistor including an oxide-based semiconductor layer.

Each of the plurality of lower layers may include the same material as a material of the oxide-based semiconductor layer.

The display panel may further include a first partition wall and a second partition wall in the non-display area, and the first partition wall and the second partition wall may be arranged in a direction from the display area to the opening.

The first partition wall may include a plurality of protrusions and a recess between adjacent protrusions, and a portion of the organic encapsulation layer may be in the recess.

A first portion of the first inorganic encapsulation layer and a first portion of the second inorganic encapsulation layer may be in direct contact with each other on one of the plurality of protrusions of the first partition wall.

A second portion of the first inorganic encapsulation layer and a second portion of the second inorganic encapsulation layer may be in direct contact with each other on the second partition wall.

At least one of the plurality of grooves may be defined between the first partition wall and the second partition wall.

The at least one groove between the first partition wall and the second partition wall may be covered with the organic encapsulation layer.

The plurality of grooves may include two or more grooves between the first partition wall and the second partition wall, and a first groove adjacent to the first partition wall among the two or more grooves may include a pair of tips protruding toward a center of the first groove.

The plurality of light-emitting diodes may include an emission layer between a first electrode and a second electrode, and a functional layer between the first electrode and the second electrode. Each of the functional layer and the second electrode may extend to the non-display area and be disconnected or separated by the pair of tips of the first groove in the non-display area.

A second groove adjacent to the second partition wall among the two or more grooves may not include a tip on at least one of opposite sides of a virtual vertical line passing through a center of the second groove, and the functional layer and the second electrode may continuously cover an inner surface of the groove on the at least one side of the second groove.

The display panel may further include a metal dummy stack on opposite sides of a virtual vertical line passing through a center of each of the plurality of grooves, and the metal dummy stack may include a plurality of metal layers stacked with an insulating layer therebetween.

Other aspects, features, and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
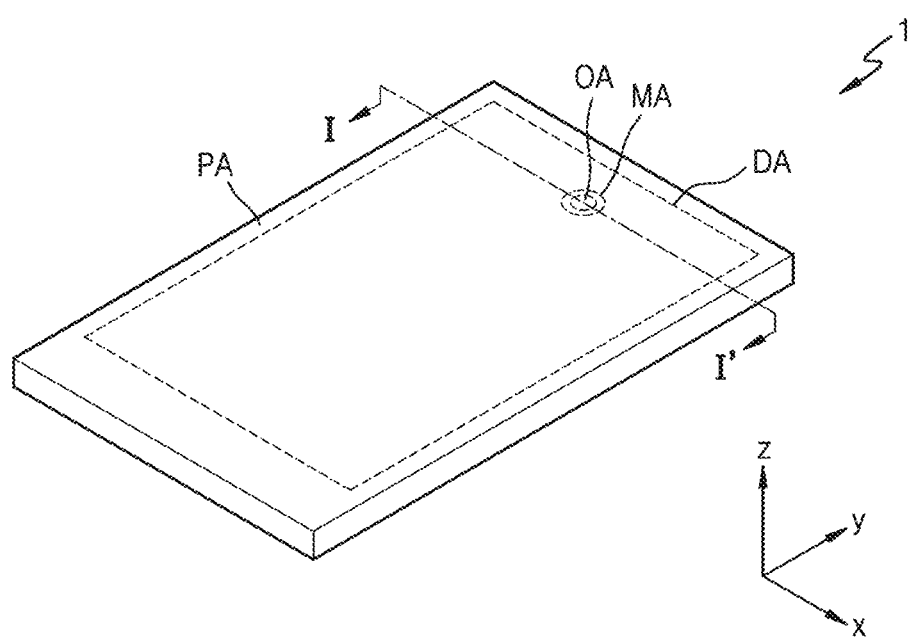
FIG. 1 is a schematic perspective view of an electronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

The embodiments of the disclosure will be described below in more detail with reference to the accompanying drawings. Those elements that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

FIG. 1 is a schematic perspective view of an electronic apparatus 1 according to an embodiment.

Referring to FIG. 1, the electronic apparatus 1 is configured to display a moving image or a still image and may be used as display screens for various products, including not only portable electronic apparatuses, such as mobile phones, smartphones, tablet personal computers ("PCs"), mobile communication terminals, electronic notebooks, e-books, portable multimedia players ("PMPs"), navigations, and ultra mobile PCs ("UMPCs"), and but also televisions ("TVs"), laptops, monitors, billboards, and internet of things ("IoT") devices. The electronic apparatus 1 according to an embodiment may also be used in wearable devices, such as smart watches, watch phones, glasses-type displays, or head mounted displays ("HMDs"). The electronic apparatus 1 according to an embodiment may also be used as dashboards of automobiles, center information displays ("CIDs") on the center fascia or dashboards of automobiles, room mirror displays that replace side mirrors of automobiles, and displays arranged on the rear sides of front seats to serve as entertainment devices for backseat passengers of automobiles. In FIG. 1, for convenience of description, the electronic apparatus 1 according to an embodiment is used as a smartphone.

The electronic apparatus 1 may have a rectangular shape in a plan view. For example, as illustrated in FIG. 1, the electronic apparatus 1 may have a rectangular planar shape having a short side (i.e., latitudinal side) in an x direction and a long side (i.e., longitudinal side) in a y direction. An edge at which the short side in the x direction and the long side in the y direction meet each other may have a right angle or may be round to have a certain curvature. The planar shape of the electronic apparatus 1 according to the invention is not limited to a rectangle, but may have another polygonal shape, an elliptical shape, or an irregular shape in another embodiment.

The electronic apparatus 1 may include an opening area OA (or a first area) and a display area DA (or a second area) surrounding at least the opening area OA. The electronic apparatus 1 may include a non-display area (or a third area) that is adjacent to the opening area OA and is provided inside the display area DA (hereinafter referred to as an inner non-display area MA), and a non-display area (or a fourth area) that is provided outside the display area DA (hereinafter referred to as an outer non-display area PA). The inner non-display area MA may have a closed loop shape that completely surrounds the opening area OA in a plan view, and may be completely surrounded by the display area DA. The outer non-display area PA may completely surround the display area DA in a plan view.

The opening area OA may be defined inside the display area DA. According to an embodiment, as illustrated in FIG. 1, the opening area OA may be in the upper center of the display area DA. Alternatively, the opening area OA may be variously arranged. For example, the opening area OA may be on the upper left side of the display area DA or the upper right side of the display area DA in another embodiment. FIG. 1 illustrates that one opening area OA is arranged, but in another embodiment, a plurality of opening areas OA may be provided.

Figure 2:
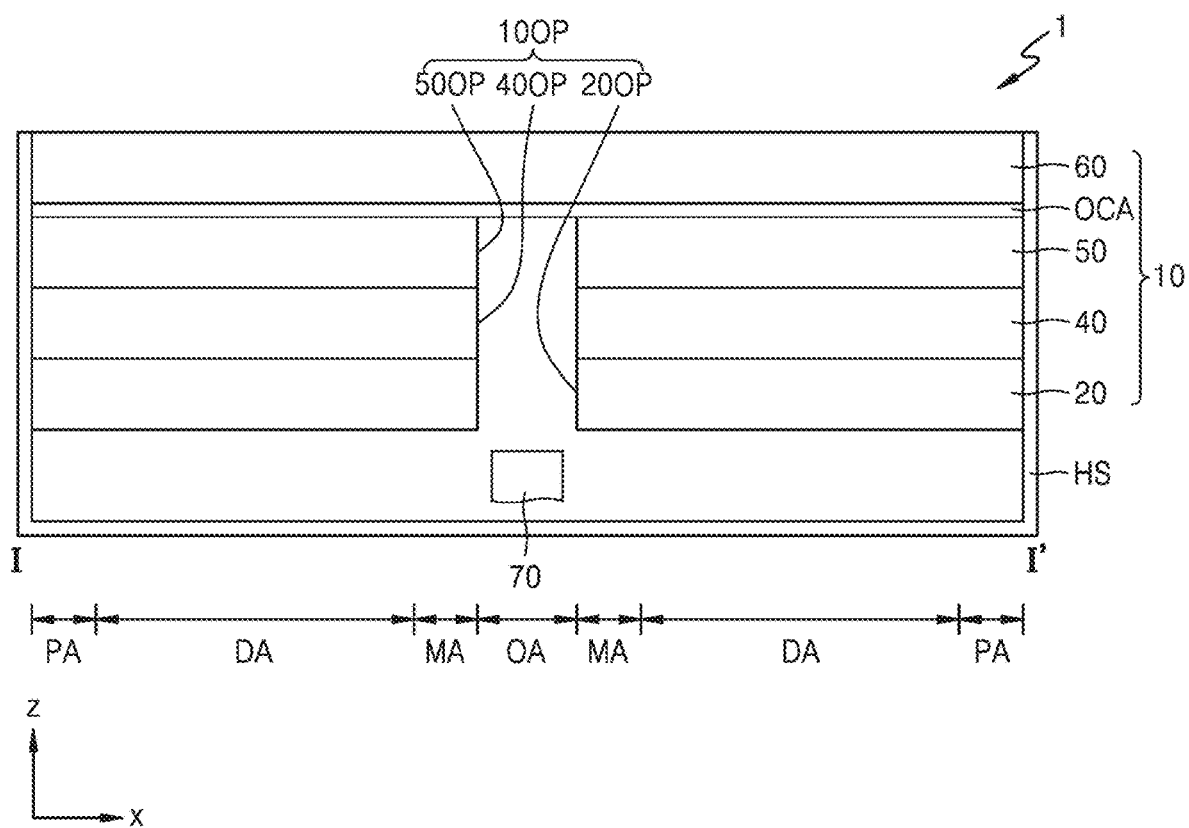
FIG. 2 is a schematic cross-sectional view of a display panel taken along line I-I' of FIG. 1, according to an embodiment.

FIG. 2 is a schematic cross-sectional view of a display panel 10 taken along line I-I' of FIG. 1, according to an embodiment.

Referring to FIG. 2, the electronic apparatus 1 may include the display panel 10 and a component 70 in the opening area OA of the display panel 10. The display panel 10 and the component 70 may be accommodated in a housing HS.

The display panel 10 may include an image generating layer 20, an input sensing layer 40, an optical functional layer 50, and a cover window 60.

The image generating layer 20 may include display elements (i.e., light-emitting elements) that emit light to display an image. The display elements may include a light-emitting diode, for example, an organic light-emitting diode including an organic emission layer. According to another embodiment, the light-emitting diode may include an inorganic light-emitting diode including an inorganic material. The inorganic light-emitting diode may include a PN junction diode including inorganic semiconductor-based materials. When a voltage is applied to the PN junction diode in a forward direction, holes and electrons may be injected and recombined to generate energy. The PN junction diode may convert the generated energy into light energy to emit light of a certain color. The inorganic light-emitting diode may have a width of several to several hundred micrometers or several to several hundred nanometers. According to some embodiments, the image generating layer 20 may include a quantum dot light-emitting diode. For example, the emission layer of the image generating layer 20 may include an organic material, an inorganic material, quantum dots, an organic material and quantum dots, or an inorganic material and quantum dots.

The input sensing layer 40 may obtain coordinate information of an external input, for example, a touch event. The input sensing layer 40 may include a sensing electrode (e.g., a touch electrode) and trace lines electrically connected to the sensing electrode. The input sensing layer 40 may be above the image generating layer 20. The input sensing layer 40 may sense an external input by using a mutual cap (mutual-capacitive) method and/or a self cap (self-capacitive) method.

The input sensing layer 40 may be disposed directly on the image generating layer 20, or may be separately formed and then bonded through an adhesive layer such as an optical clear adhesive ("OCA"). In another embodiment, for example, the input sensing layer 40 may be continuously formed after the process of forming the image generating layer 20. In this case, the adhesive layer may not be between the input sensing layer 40 and the image generating layer 20. FIG. 2 illustrates that the input sensing layer 40 is between the image generating layer 20 and the optical functional layer 50, but in another embodiment, the input sensing layer 40 may be above the optical functional layer 50.

The optical functional layer 50 may include an anti-reflective layer. The anti-reflective layer may reduce reflectance of light (external light) incident from the outside toward the display panel 10 through the cover window 60. The anti-reflective layer may include a retarder and a polarizer. According to another embodiment, the anti-reflective layer may include a black matrix and color filters. The color filters may be arranged considering the color of light emitted from each light-emitting diode of the image generating layer 20.

In order to improve the transmittance of the opening area OA, the display panel 10 may include an opening 10OP passing through some layers constituting the display panel 10. The opening 10OP may include first to third openings 20OP, 40OP, and 50OP passing through the image generating layer 20, the input sensing layer 40, and the optical functional layer 50, respectively. The first opening 20OP of the image generating layer 20, the second opening 40OP of the input sensing layer 40, and the third opening 50OP of the optical functional layer 50 may overlap each other to define the opening 10OP of the display panel 10 in a plan view.

The cover window 60 may be on the optical functional layer 50. The cover window 60 may be bonded to the optical functional layer 50 through an adhesive layer such as an OCA therebetween. The cover window 60 may cover the first opening 20OP of the image generating layer 20, the second opening 40OP of the input sensing layer 40, and the third opening 50OP of the optical functional layer 50.

The cover window 60 may include a glass material or a plastic material. The glass material may include ultra-thin glass. The plastic material may include polyethersulfone, polyacrylate, polyetherimide, polyethylene naphthalate, polyethylene terephthalate, polyphenylene sulfide, polyarylate, polyimide, polycarbonate, or cellulose acetate propionate.

The opening area OA may be a component area (e.g., a sensor area, a camera area, a speaker area, etc.) in which the component 70 for adding various functions to the electronic apparatus 1 is positioned.

The component 70 may include an electronic element. For example, the component 70 may include an electronic element using light or sound. For example, the electronic element may include a sensor (e.g., an infrared sensor) using light, a camera configured to receive light to capture an image, a sensor configured to measure a distance or recognizes a fingerprint by outputting and sensing light or sound, a small lamp configured to output light, a speaker configured to output sound, or the like. The electronic element using light may use light of various wavelength bands such as visible light, infrared light, or ultraviolet light. The opening area OA may correspond to an area through which light or/and sound that is output from the component 70 to the outside or directed from the outside to the electronic element may be transmitted.

Figure 3:
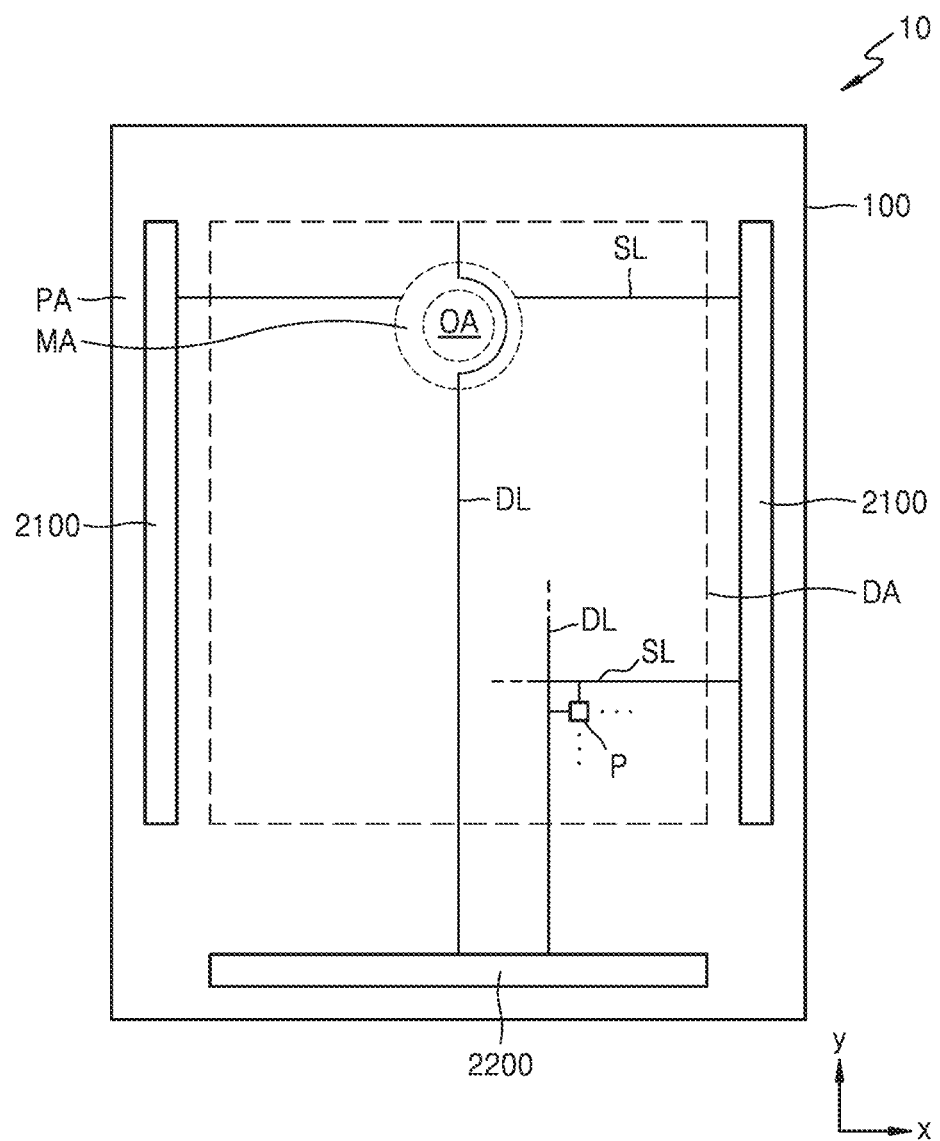
FIG. 3 is a schematic plan view of a display panel according to an embodiment.

FIG. 3 is a schematic plan view of a display panel 10 according to an embodiment.

Referring to FIG. 3, the display panel 10 may include an opening area OA, a display area DA, an inner non-display area MA, and an outer non-display area PA.

The display panel 10 may include a plurality of sub-pixels P in the display area DA, and the display panel 10 may display an image using light emitted from each of the sub-pixels P. Each of the sub-pixels P may emit red light, green light, or blue light by using a light-emitting diode. The light-emitting diode of each of the sub-pixels P may be electrically connected to a scan line SL and a data line DL.

In the outer non-display area PA, a scan driver 2100 configured to provide a scan signal to each of the sub-pixels P, a data driver 2200 configured to provide a data signal to each of the sub-pixels P, and a first main power line (not illustrated) and a second main power line (not illustrated) configured to provide a first power supply voltage and a second power supply voltage, respectively, may be arranged. Scan drivers 2100 may be disposed on opposite sides with the display area DA therebetween. In this case, the sub-pixels P on the left side of the opening area OA may be connected to the scan driver 2100 on the left side, and the sub-pixels P on the right side of the opening area OA may be connected to the scan driver 2100 on the right side.

The inner non-display area MA may surround the opening area OA. The inner non-display area MA is an area in which no display elements such as light-emitting diodes are arranged. Signal lines configured to provide signals to the sub-pixels P around the opening area OA may pass through the inner non-display area MA. For example, data lines DL and/or scan lines SL may cross the display area DA, but some data lines DL and/or some scan lines SL may bypass the opening 10OP in the inner non-display area MA along the edge of the opening 10OP. According to an embodiment, FIG. 3 illustrates that the data lines DL cross the display area DA in the y direction, but some data lines DL may bypass the opening area OA to partially surround the opening area OA in the inner non-display area MA. The scan lines SL may cross the display area DA in the x direction, but may be apart from each other with the opening area OA therebetween.

FIG. 3 illustrates that the data driver 2200 is adjacent to one side of the substrate 100, but in another embodiment, the data driver 2200 may be on a printed circuit board electrically connected to a pad on one side of the display panel 10. The printed circuit board may be flexible, and a portion of the printed circuit board may be bent so as to be positioned under the rear surface of the substrate 100.

Figure 4:
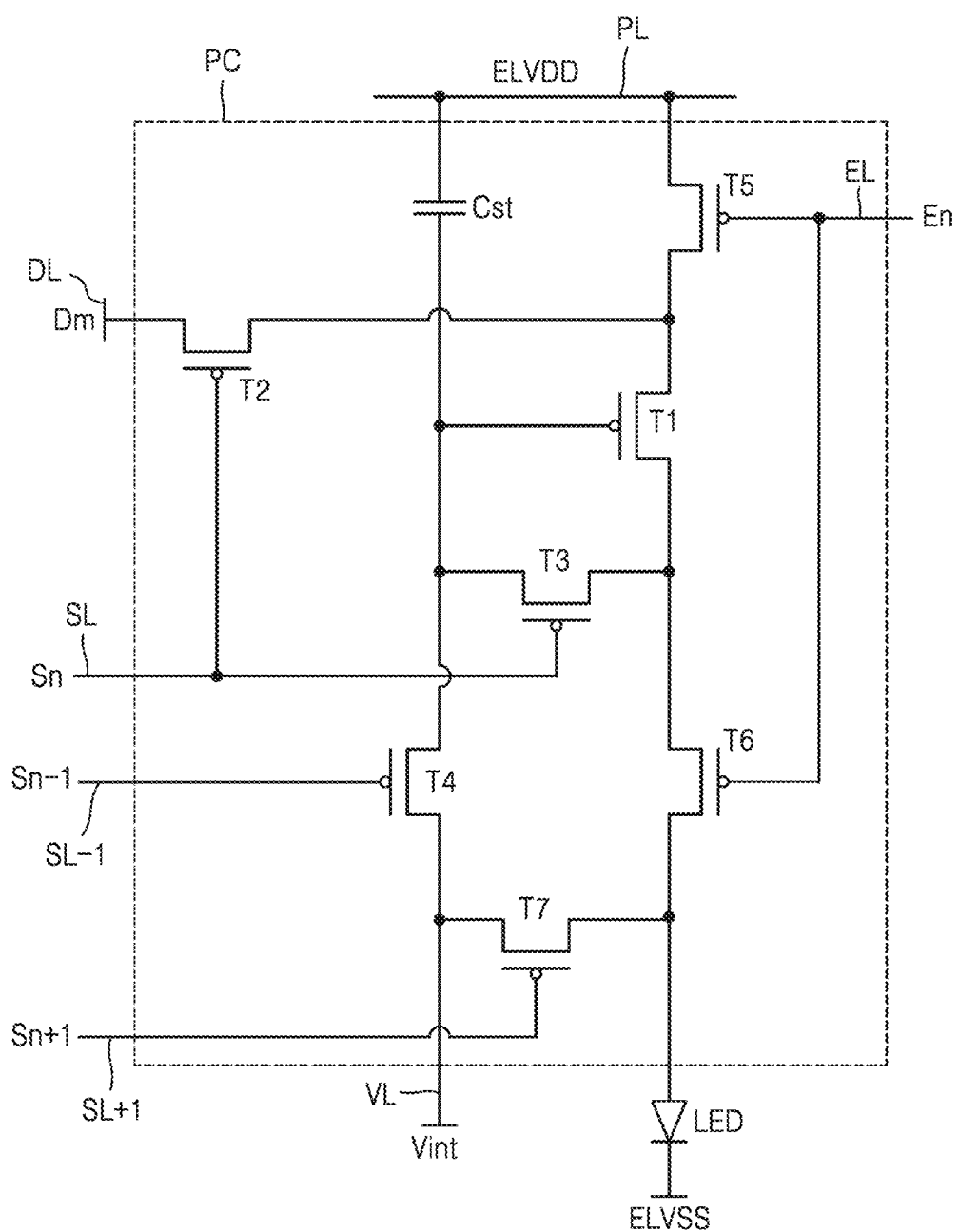
FIG. 4 is a schematic equivalent circuit diagram of a light-emitting diode and a circuit connected to the light-emitting diode, according to an embodiment.

FIG. 4 is a schematic equivalent circuit diagram of a light-emitting diode LED and a circuit connected to the light-emitting diode LED, according to an embodiment.

Referring to FIG. 4, the sub-pixel P described with reference to FIG. 3 may emit light from the light-emitting diode LED, and the light-emitting diode LED may be electrically connected to a sub-pixel circuit PC.

The sub-pixel circuit PC may include a first thin-film transistor T1, a second thin-film transistor T2, a third thin-film transistor T3, a fourth thin-film transistor T4, a fifth thin-film transistor T5, a sixth thin-film transistor T6, a seventh thin-film transistor T7, and a storage capacitor Cst.

The second thin-film transistor T2 acts as a switching thin-film transistor. The second thin-film transistor T2 may be connected to a scan line SL and a data line DL and may be configured to transmit a data voltage (i.e., a data signal Dm) input from the data line DL to the first thin-film transistor T1, based on a switching voltage (i.e., a switching signal Sn) input from the scan line SL. The storage capacitor Cst may be connected to the second thin-film transistor T2 and a driving voltage line PL and may be configured to store a voltage corresponding to a difference between a voltage received from the second thin-film transistor T2 and a first power supply voltage ELVDD supplied to the driving voltage line PL.

The first thin-film transistor T1 acts as a driving thin-film transistor. The first thin-film transistor T1 may be connected to the driving voltage line PL and the storage capacitor Cst and may be configured to control a driving current flowing from the driving voltage line PL to the light-emitting diode LED in response to a voltage value stored in the storage capacitor Cst. The light-emitting diode LED may emit light having a certain luminance according to the driving current. A second electrode (e.g., a cathode) of the light-emitting diode LED may be configured to receive a second power supply voltage ELVSS.

The third thin-film transistor T3 acts as a compensation thin-film transistor, and a gate electrode of the third thin-film transistor T3 may be connected to the scan line SL. A source electrode (or a drain electrode) of the third thin-film transistor T3 may be connected to a drain electrode (or a source electrode) of the first thin-film transistor T1, and may be connected to a first electrode of the light-emitting diode LED via the sixth thin-film transistor T6. The drain electrode (or the source electrode) of the third thin-film transistor T3 may be connected to any one electrode of the storage capacitor Cst, a source electrode (or a drain electrode) of the fourth thin-film transistor T4, and a gate electrode of the first thin-film transistor T1. The third thin-film transistor T3 may be turned on in response to the scan signal Sn received through the scan line SL and diode-connect the first thin-film transistor T1 by connecting the gate electrode and the drain electrode of the first thin-film transistor T1 to each other.

The fourth thin-film transistor T4 acts as an initialization thin-film transistor, and a gate electrode of the fourth thin-film transistor T4 may be connected to a previous scan line SL-1. The drain electrode (or the source electrode) of the fourth thin-film transistor T4 may be connected to an initialization voltage line VL. The source electrode (or the drain electrode) of the fourth thin-film transistor T4 may be connected to any one electrode of the storage capacitor Cst, the source electrode (or the drain electrode) of the third thin-film transistor T3, and the gate electrode of the first thin-film transistor T1. The fourth thin-film transistor T4 may be turned on in response to a previous scan signal Sn-1 received through the previous scan line SL-1 and perform an initialization operation of initializing the voltage of the gate electrode of the first thin-film transistor T1 by transmitting an initialization voltage Vint to the gate electrode of the first thin-film transistor T1.

The fifth thin-film transistor T5 acts as an operation control thin-film transistor, and a gate electrode of the fifth thin-film transistor T5 may be connected to an emission control line EL. A source electrode (or a drain electrode) of the fifth thin-film transistor T5 may be connected to the driving voltage line PL. The drain electrode (or the source electrode) of the fifth thin-film transistor T5 may be connected to the source electrode (or the drain electrode) of the first thin-film transistor T1 and a drain electrode (or a source electrode) of the second thin-film transistor T2.

The sixth thin-film transistor T6 acts as an emission control thin-film transistor, and a gate electrode of the sixth thin-film transistor T5 may be connected to the emission control line EL. A source electrode (or a drain electrode) of the sixth thin-film transistor T6 may be connected to the drain electrode (or the source electrode) of the first thin-film transistor T1 and the source electrode (or the drain electrode) of the third thin-film transistor T3. The drain electrode (or the source electrode) of the sixth thin-film transistor T6 may be electrically connected to the first electrode of the light-emitting diode LED. The fifth thin-film transistor T5 and the sixth thin-film transistor T6 may be simultaneously turned on in response to an emission control signal En received through the emission control line EL, so that the driving voltage ELVDD is transmitted to the light-emitting diode LED and the driving current flows through the light-emitting diode LED.

The seventh thin-film transistor T7 may be an initialization thin-film transistor configured to initialize the first electrode of the light-emitting diode LED. A gate electrode of the seventh thin-film transistor T7 may be connected to a next scan line SL+1. A source electrode (or a drain electrode) of the seventh thin-film transistor T7 may be connected to the first electrode of the light-emitting diode LED. The drain electrode (or the source electrode) of the seventh thin-film transistor T7 may be connected to the initialization voltage line VL. The seventh thin-film transistor T7 may be turned on in response to a next scan signal Sn+1 received through the next scan line SL+1 and initialize the first electrode of the light-emitting diode LED.

FIG. 4 illustrates a case in which the fourth thin-film transistor T4 and the seventh thin-film transistor T7 are connected to the previous scan line SL-1 and the next scan line SL+1, respectively, but in another embodiment, both the fourth thin-film transistor T4 and the seventh thin-film transistor T7 may be connected to the previous scan line SLn-1 and may be driven in response to the previous scan signal Sn-1.

The other electrode of the storage capacitor Cst may be connected to the driving voltage line PL. Any one electrode of the storage capacitor Cst may be connected to the gate electrode of the first thin-film transistor T1, the drain electrode (or the source electrode) of the third thin-film transistor T3, and the source electrode (or the drain electrode) of the fourth thin-film transistor T4.

The second electrode (e.g., the cathode) of the light-emitting diode LED may be configured to receive the second power supply voltage ELVSS. The light-emitting diode LED receives the driving current from the first thin-film transistor T1 and emits light.

Figure 5:
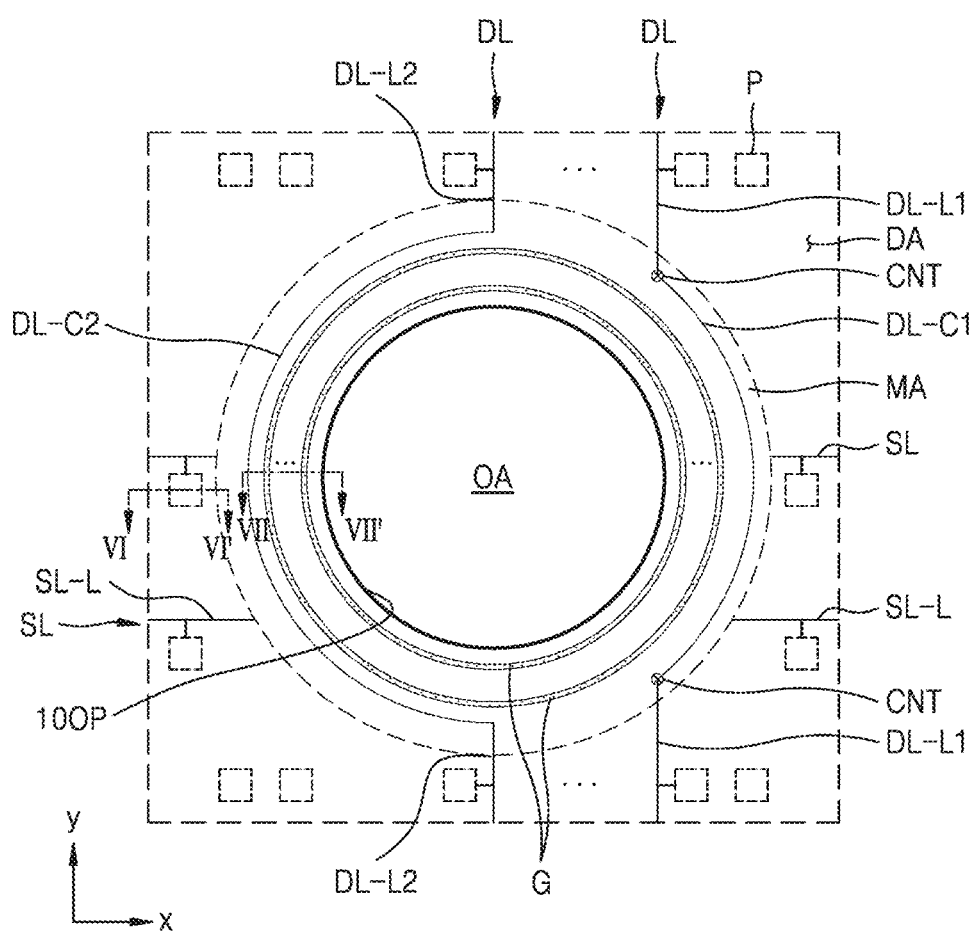
FIG. 5 is a plan view of a portion of a display panel, according to an embodiment.

FIG. 5 is a plan view of a portion of a display panel, according to an embodiment.

Referring to FIG. 5, sub-pixels P are in a display area DA. An inner non-display area MA may be disposed between an opening area OA and the display area DA. The sub-pixels P, which are adjacent to the opening area OA, may be apart from each other with the opening area OA therebetween in a plan view. In the plan view of FIG. 5, the sub-pixels P may be vertically apart from each other with the opening area OA therebetween, or may be horizontally apart from each other with the opening area OA therebetween. As described above with reference to FIGS. 3 and 4, because the sub-pixels P use red light, green light, and blue light emitted from light-emitting diodes, the positions of the sub-pixels P illustrated in FIG. 4 correspond to the positions of the light-emitting diodes, respectively. Therefore, that the sub-pixels P are apart from each other with the opening area OA therebetween in a plan view may mean that the light-emitting diodes are apart from each other with the opening area OA therebetween in a plan view. For example, in the plan view, the light-emitting diodes may be vertically apart (i.e., y direction) from each other with the opening area OA therebetween, or may be horizontally apart (i.e., x direction) from each other with the opening area OA therebetween.

Among signal lines configured to supply signals to the pixel circuit connected to the light-emitting diode of each of the sub-pixels P, signal lines adjacent to the opening area OA may bypass the opening area OA and/or the opening 10OP. Some data lines DL passing through the display area DA may extend in the ±y direction such that data signals are provided to the sub-pixels P above and below the opening area OA in a plan view, and may bypass the opening area OA along the edge of the opening area OA and/or the opening 10OP in the inner non-display area MA.

A bypass portion DL-C1 of at least one data line DL may be on a layer different from an extension portion DL-L1 crossing the display area DA, and the bypass portion DL-C1 of the data line DL and the extension portion DL-L1 may be connected through a contact hole CNT. A bypass portion DL-C2 of at least one of the data lines DL may be on the same layer as an extension portion DL-L2, and the bypass portion DL-C2 may be integral with the extension portion DL-L2.

The scan line SL may be separated or disconnected with the opening area OA therebetween. As described above with reference to FIG. 3, the scan line SL on the left side of the opening area OA may be configured to receive a signal from the scan driver 2100 on the left side of the display area DA, and the scan line SL on the right side of the opening area OA may be configured to receive a signal from the scan driver 2100 on the right side of the display area DA.

Grooves G may be defined between the opening area OA and the area of the inner non-display area MA that the data lines DL bypass. The grooves G may each have a closed loop shape surrounding the opening area OA in a plan view, and the grooves G may be apart from each other.

Figure 6:
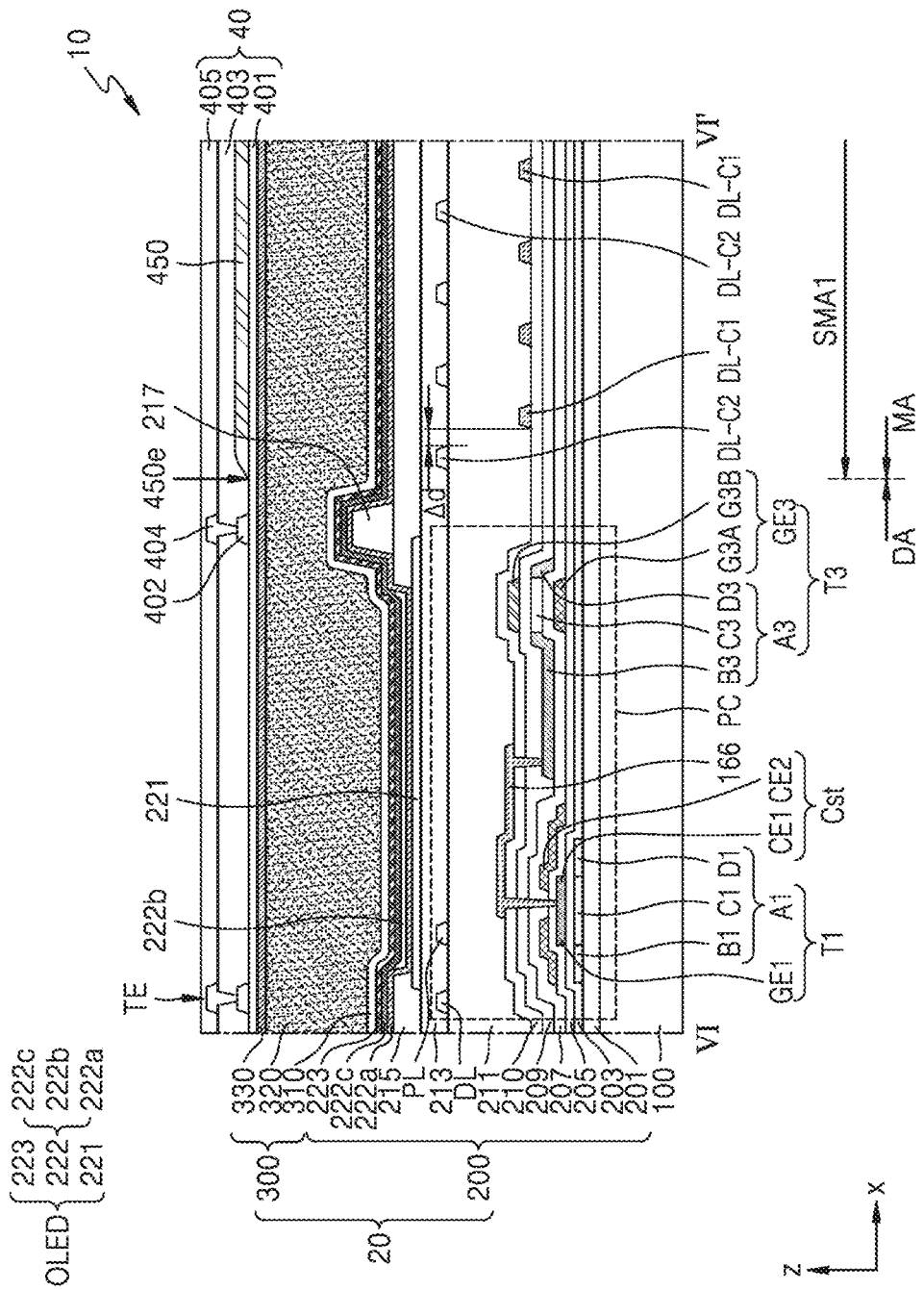
FIG. 6 is a cross-sectional view of the display panel taken along line VI-VI' of FIG. 5, according to an embodiment.

FIG. 6 is a cross-sectional view of the display panel 10 taken along line VI-VI' of FIG. 5, according to an embodiment.

Referring to the display area DA of FIG. 6, the substrate 100 may include a glass material or a polymer resin. According to an embodiment, the substrate 100 may have a structure in which a base layer including a polymer resin and a barrier layer including an inorganic insulating material such as silicon oxide or silicon nitride are alternately stacked. The polymer resin may include a polymer resin such as polyethersulfone, polyarylate, polyether imide, polyethylene naphthalate, polyethylene terephthalate, polyphenylene sulfide, polyimide, polycarbonate, cellulose triacetate, and cellulose acetate propionate.

The sub-pixel circuit PC may be disposed on the substrate 100, and the light-emitting diode such as the organic light-emitting diode OLED may be on the sub-pixel circuit PC.

Before the sub-pixel circuit PC is formed, a buffer layer 201 may be formed on the substrate 100 so as to prevent infiltration of impurities into the sub-pixel circuit PC. The buffer layer 201 may include an inorganic insulating material such as silicon nitride, silicon oxynitride, and silicon oxide, and may have a single-layer structure or a multilayer structure including the afore-described inorganic insulating material.

The sub-pixel circuit PC may include a plurality of transistors and a storage capacitor, as described above with reference to FIG. 4. In this regard, FIG. 6 illustrates a first thin-film transistor T1, a third thin-film transistor T3, and a storage capacitor Cst of the sub-pixel circuit PC.

The first thin-film transistor T1 may include a semiconductor layer (hereinafter referred to as a first semiconductor layer A1) on the buffer layer 201 and a gate electrode (hereinafter referred to as a first gate electrode GE1) overlapping a channel region C1 of the first semiconductor layer A1 in a plan view. The first semiconductor layer A1 may include a silicon-based semiconductor material, for example, polysilicon. The first semiconductor layer A1 may include the channel region C1, and a first region B1 and a second region D1 on opposite sides of the channel region C1. The first region B1 and the second region D1 are regions including a higher concentration of impurities than the channel region C1. One of the first region B1 and the second region D1 may correspond to a source region and the other thereof may correspond to a drain region.

A first gate insulating layer 203 may be between the first semiconductor layer A1 and the first gate electrode GE1. The first gate insulating layer 203 may include an inorganic insulating material such as silicon oxide, silicon nitride, and silicon oxynitride, and may have a single-layer structure or a multilayer structure including the above-described inorganic insulating material.

The first gate electrode GE1 may include a conductive material including molybdenum (Mo), aluminum (Al), copper (Cu), titanium (Ti), or the like, and may have a single layer or multiple layers including the above-described material.

The storage capacitor Cst may include a lower electrode CE1 and an upper electrode CE2 overlapping each other in a plan view. According to an embodiment, the lower electrode CE1 of the storage capacitor Cst may correspond to the first gate electrode GE1. In other words, the first gate electrode GE1 may correspond to the lower electrode CE1 of the storage capacitor Cst. For example, the first gate electrode GE1 may be integral with the lower electrode CE1 of the storage capacitor Cst.

A first interlayer-insulating layer 205 may be between the lower electrode CE1 and the upper electrode CE2 of the storage capacitor Cst. The first interlayer-insulating layer 205 may include an inorganic insulating material such as silicon oxide, silicon nitride, and silicon oxynitride, and may have a single-layer structure or a multilayer structure including the above-described inorganic insulating material.

The upper electrode CE2 of the storage capacitor Cst may include a low-resistance conductive material such as molybdenum (Mo), aluminum (Al), copper (Cu), and/or titanium (Ti), and may have a single-layer structure or a multilayer structure including the above-described material.

A second interlayer-insulating layer 207 may be on the storage capacitor Cst. The second interlayer-insulating layer 207 may include an inorganic insulating material such as silicon oxide, silicon nitride, and silicon oxynitride, and may have a single-layer structure or a multilayer structure including the above-described inorganic insulating material.

A semiconductor layer (hereinafter referred to as a third semiconductor layer A3) of the third thin-film transistor T3 may be on the second interlayer-insulating layer 207. The third semiconductor layer A3 may include an oxide-based semiconductor material. For example, the third semiconductor layer A3 may include a Zn oxide-based material, for example, Zn oxide, In—Zn oxide, Ga—In—Zn oxide, or the like. According to some embodiments, the third semiconductor layer A3 may include In—Ga—Zn—O ("IGZO"), In—Sn—Zn—O ("ITZO"), or In—Ga—Sn—Zn—O ("IGTZO") semiconductor, in which a metal such as indium (In), gallium (Ga), and tin (Sn) is included in ZnO.

The third semiconductor layer A3 may include a channel region C3, and a first region B3 and a second region D3 on opposite sides of the channel region C3. One of the first region B3 and the second region D3 may correspond to a source region and the other thereof may correspond to a drain region.

The third thin-film transistor T3 may include a gate electrode (hereinafter referred to as a third gate electrode GE3) overlapping the channel region C3 of the third semiconductor layer A3 in a plan view. The third gate electrode GE3 may have a double gate structure including a lower gate electrode G3A below the third semiconductor layer A3 and an upper gate electrode G3B above the channel region C3.

The lower gate electrode G3A may be on the same layer (e.g., the first interlayer-insulating layer 205) as the upper electrode CE2 of the storage capacitor Cst. The lower gate electrode G3A may include the same material as that of the upper electrode CE2 of the storage capacitor Cst.

The upper gate electrode G3B may be above the third semiconductor layer A3 with the second gate insulating layer 209 therebetween. The second gate insulating layer 209 may include an inorganic insulating material such as silicon oxide, silicon nitride, and silicon oxynitride, and may have a single-layer structure or a multilayer structure including the above-described inorganic insulating material.

The third interlayer-insulating layer 210 may be on the upper gate electrode G3B. The third interlayer-insulating layer 210 may include an inorganic insulating material such as silicon oxynitride, and may have a single-layer structure or a multilayer structure including the above-described inorganic insulating material.

Although FIG. 6 illustrates the first thin-film transistor T1 and the third thin-film transistor T3 among the thin-film transistors as described above with reference to FIG. 4 and illustrates that the first semiconductor layer A1 and the third semiconductor layer A3 are on different layers from each other, the disclosure according to the invention is not limited thereto.

Each of the second, fifth, sixth, and seventh thin-film transistors T2, T5, T6, and T7, which have been described above with reference to FIG. 4, may have the same structure as that of the first thin-film transistor T1 described above with reference to FIG. 6. For example, each of the second, fifth, sixth, and seventh thin-film transistors T2, T5, T6, and T7 (see FIG. 4) may include a semiconductor layer on the same layer as the first semiconductor layer A1 of the first thin-film transistor T1 and a gate electrode on the same layer as the first gate electrode GE1 of the first thin-film transistor T1. The semiconductor layer of each of the second, fifth, sixth, and seventh thin-film transistors T2, T5, T6, and T7 (see FIG. 4) may be integrally connected to the first semiconductor layer A1.

The fourth thin-film transistor T4 described above with reference to FIG. 4 may have the same structure as that of the third thin-film transistor T3 described above with reference to FIG. 6. For example, the fourth thin-film transistor T4 may include a semiconductor layer on the same layer as the third semiconductor layer A3 of the third thin-film transistor T3 and a gate electrode on the same layer as the third gate electrode GE3 of the third thin-film transistor T3. The semiconductor layer of the fourth thin-film transistor T4 may be integrally connected to the third semiconductor layer A3 of the third thin-film transistor T3.

The first thin-film transistor T1 and the third thin-film transistor T3 may be electrically connected to each other through a node connection line 166. The node connection line 166 may be on the third interlayer-insulating layer 210. One side of the node connection line 166 may be connected to the first gate electrode GE1 of the first thin-film transistor T1, and the other side of the node connection line 166 may be connected to the third semiconductor layer A3 of the third thin-film transistor T3.

The node connection line 166 may include aluminum (Al), copper (Cu), and/or titanium (Ti), and may have a single layer or multiple layers including the above-described material. For example, the node connection line 166 may have a three-layer structure of Ti/Al/Ti.

A first organic insulating layer 211 may be on the node connection line 166. The first organic insulating layer 211 may include an organic insulating material. The organic insulating material may include acryl, benzocyclobutene ("BCB"), polyimide, or hexamethyldisiloxane ("HMDSO").

A data line DL and a driving voltage line PL may be on the first organic insulating layer 211, and may be covered with a second organic insulating layer 213. The data line DL and the driving voltage line PL may include aluminum (Al), copper (Cu), and/or titanium (Ti), and may have a single layer or multiple layers including the above-described material. For example, the data line DL and the driving voltage line PL may have a three-layer structure of Ti/Al/Ti.

The second organic insulating layer 213 may include an organic insulating material such as acryl, BCB, polyimide, and/or HMDSO. Although FIG. 6 illustrates that the data line DL and the driving voltage line PL are on the first organic insulating layer 211, the disclosure according to the invention is not limited thereto. According to another embodiment, one of the data line DL and the driving voltage line PL may be on the same layer as the node connection line 166.

A light-emitting diode such as an organic light-emitting diode OLED may be on the second organic insulating layer 213.

A first electrode 221 of the organic light-emitting diode OLED may include a reflective layer including silver (Ag), magnesium (Mg), aluminum (Al), platinum (Pt), palladium (Pd), gold (Au), nickel (Ni), neodymium (Nd), Iridium (Ir), chromium (Cr), or any compound thereof. According to another embodiment, the first electrode 221 may further include a conductive oxide layer above and/or below the above-described reflective layer. The conductive oxide layer may include indium tin oxide ("ITO"), indium zinc oxide ("IZO"), zinc oxide (ZnO), indium oxide ($In_2O_3$), indium gallium oxide ("IGO"), and/or aluminum zinc oxide ("AZO"). According to an embodiment, the first electrode 221 may have a three-layer structure of ITO/Ag/ITO.

A bank layer 215 may be on the first electrode 221. The bank layer 215 may define an opening overlapping the first electrode 221 in a plan view, and may cover the edge of the first electrode 221. The bank layer 215 may include an organic insulating material.

An intermediate layer 222 may include an emission layer 222b. The intermediate layer 222 may include a first functional layer 222a below the emission layer 222b and/or a second functional layer 222c above the emission layer 222b. The emission layer 222b may include a high molecular weight organic material or a low molecular weight organic material that emits light of a certain color. The second functional layer 222c may include an electron transport layer ("ETL") and/or an electron injection layer ("EIL"). The first functional layer 222a and the second functional layer 222c may include an organic material.

The second electrode 223 may include a conductive material having a low work function. For example, the second electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the second electrode 223 may further include a layer such as ITO, IZO, ZnO, or $In_2O_3$ on the (semi)transparent layer including the above-described material.

The emission layer 222b may be on the display area DA and overlap the first electrode 221 through the opening of the bank layer 215 in a plan view. The first functional layer 222a, the second functional layer 222c, and the second electrode 223 may extend to be positioned in the inner non-display area MA as well as the display area DA.

Spacers 217 may be on the bank layer 215. The spacers 217 may be formed together with the bank layer 215 in the same process, or may be individually formed in separate processes. According to an embodiment, the spacer 217 may include an organic insulating material such as polyimide.

The organic light-emitting diode OLED may be covered with an encapsulation layer 300. The encapsulation layer 300 may include at least one organic encapsulation layer and at least one inorganic encapsulation layer. According to an embodiment, FIG. 6 illustrates that the encapsulation layer 300 includes first and second inorganic encapsulation layers 310 and 330 and an organic encapsulation layer 320 therebetween.

The first inorganic encapsulation layer 310 and the second inorganic encapsulation layer 330 may include one or more inorganic materials selected from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each be a single layer or multiple layers including the above-described material. The organic encapsulation layer 320 may include a polymer-based material. The polymer-based material may include an acrylic resin, an epoxy-based resin, polyimide, polyethylene, or the like. According to an embodiment, the organic encapsulation layer 320 may include acrylate.

The first inorganic encapsulation layer 310 and the second inorganic encapsulation layer 330 may have different thicknesses from each other in a thickness direction (i.e., z direction which is perpendicular to the x direction and they direction). The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thickness of the first inorganic encapsulation layer 310 may be equal to the thickness of the second inorganic encapsulation layer 330.

The display panel 10 may include a substrate 100, an image generating layer 20, and an input sensing layer 40 on the image generating layer 20. The image generating layer 20 may be disposed on the substrate 100 and include a circuit-diode layer 200 and an encapsulation layer 300. The circuit-diode layer 200 may include pixel circuits and light-emitting diodes.

The input sensing layer 40 may include a first touch insulating layer 401 on the second inorganic encapsulation layer 330, a first conductive layer 402 on the first touch insulating layer 401, a second touch insulating layer 403 on the first conductive layer 402, a second conductive layer 404 on the second touch insulating layer 403, and a third touch insulating layer 405 on the second conductive layer 404.

Each of the first touch insulating layer 401, the second touch insulating layer 403, and the third touch insulating layer 405 may include an inorganic insulating material and/or an organic insulating material. According to an embodiment, each of the first touch insulating layer 401 and the second touch insulating layer 403 may include an inorganic insulating material such as silicon oxide, silicon nitride, and/or silicon oxynitride, and the third touch insulating layer 405 may include an organic insulating material.

A touch electrode TE of the input sensing layer 40 may include a structure in which the first conductive layer 402 and the second conductive layer 404 are connected to each other. Alternatively, the touch electrode TE may be on one of the first conductive layer 402 and the second conductive layer 404, and may include a metal line provided in the corresponding conductive layer. Each of the first conductive layer 402 and the second conductive layer 404 may include aluminum (Al), copper (Cu), and/or titanium (Ti), and may have a single layer or multiple layers including the above-described material. For example, each of the first conductive layer 402 and the second conductive layer 404 may have a three-layer structure of Ti/Al/Ti.

Referring to the inner non-display area MA of FIG. 6, the inner non-display area MA may include a first sub-inner non-display area SMA1 through which the bypass portions DL-C1 and DL-C2 of the data lines DL described above with reference to FIG. 5 pass.

The bypass portions DL-C1 and DL-C2 of the data lines DL may be on different layers from each other. One of the bypass portions DL-C1 and DL-C2 of the adjacent data lines DL may be on the third interlayer-insulating layer 210, and the other thereof may be on the first organic insulating layer 211.

When the bypass portions DL-C1 and DL-C2 of the data lines DL are alternately arranged with an insulating layer (e.g., first organic insulating layer 211) therebetween, a pitch Δd between the bypass portions DL-C1 and DL-C2 of the data lines DL may be reduced. Therefore, the area in the inner non-display area MA may be efficiently utilized.

Figure 7:
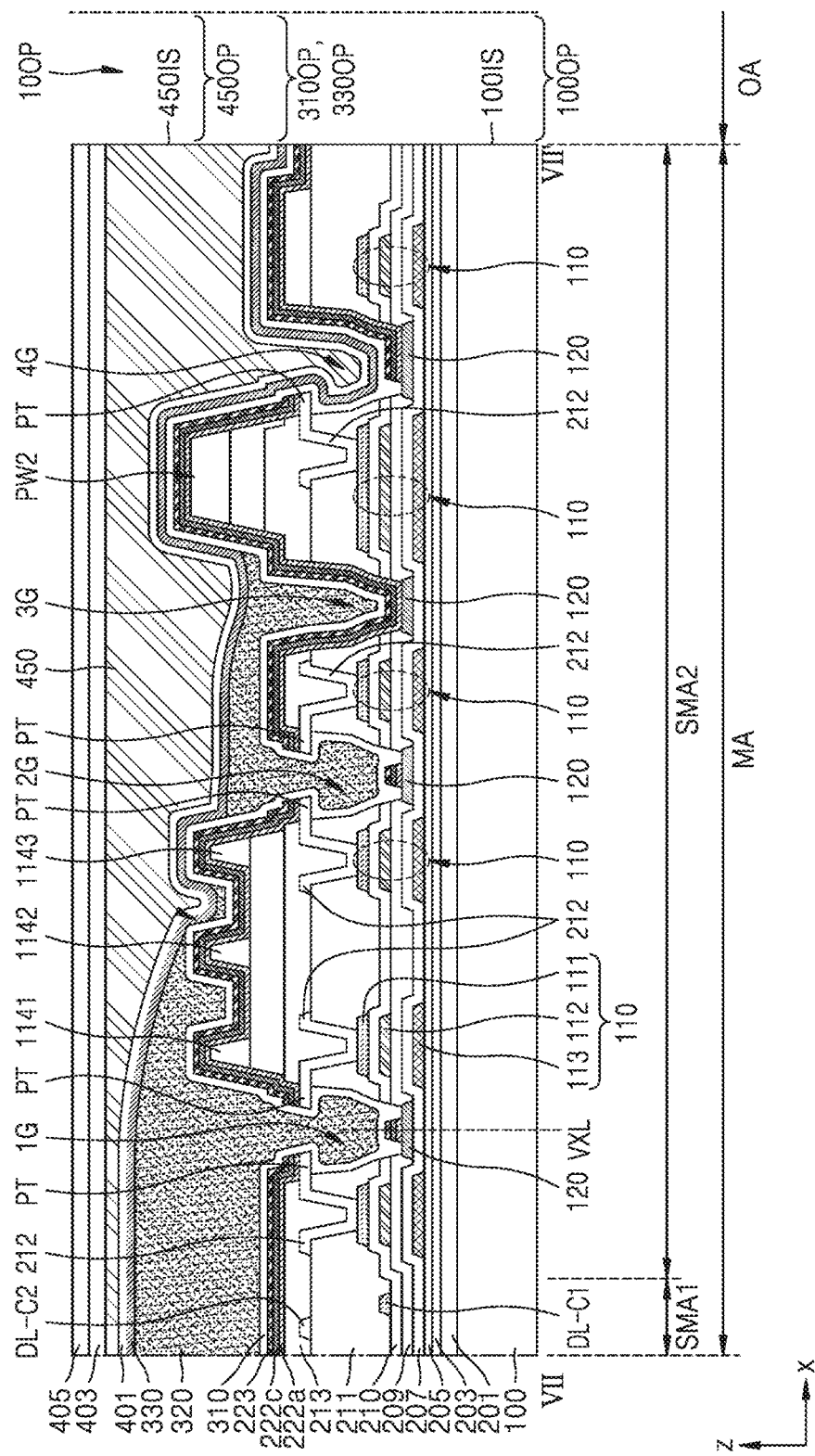
FIG. 7 is a cross-sectional view of the display panel taken along line VII-VII' of FIG. 5, according to an embodiment.

FIG. 7 is a cross-sectional view of the display panel 10 taken along line VII-VII' of FIG. 5, according to an embodiment.

Referring to FIGS. 6 and 7, the inner non-display area MA may include a first sub-inner non-display area SMA1 adjacent to the display area DA (see FIG. 6) and a second sub-inner non-display area SM2 adjacent to the opening area OA. The bypass portions DL-C1 and DL-C2 of the data lines DL described above with reference to FIG. 6 may be in the first sub-inner non-display area SMA1, and the bypass portions DL-C1 and DL-C2 of the data lines DL illustrated in the first sub-inner non-display area SMA1 of FIG. 7 may correspond to some data lines described above with reference to FIG. 6.

The bypass portions DL-C1 and DL-C2 of the data lines DL may be in the first sub-inner non-display area SMA1 of FIG. 7, the grooves G and partition walls may be in the second sub-inner non-display area SMA2, and the encapsulation layer 300 may extend to the inner non-display area MA and cover the grooves G and the partition walls.

Referring to the second sub-inner non-display area SMA2 of FIG. 7, the grooves G may be apart from each other. In this regard, FIG. 7 illustrates that first to fourth grooves 1G, 2G, 3G, and 4G are arranged in a direction from the first sub-inner non-display area SMA1 to the opening area OA.

The first to fourth grooves 1G, 2G, 3G, and 4G may have a closed loop shape surrounding the opening area OA in a plan view as described above with reference to FIG. 5.

The groove G may pass through at least one insulating layer on the buffer layer 201. The at least one insulating layer in which the groove G is defined may include the first organic insulating layer 211, and may further include an insulating layer(s) below the first organic insulating layer 211. In this regard, FIG. 7 illustrates that the first to fourth grooves 1G, 2G, 3G, and 4G pass through the second gate insulating layer 209, the third interlayer-insulating layer 210, and the first organic insulating layer 211. The grooves G, for example, the first to fourth grooves 1G, 2G, 3G, and 4G may be defined by removing portions of the second gate insulating layer 209, the third interlayer-insulating layer 210, and the first organic insulating layer 211 by an etching process.

A lower layer 120 may be positioned directly below the groove G. The lower layer 120 may function as an etch stopper during an etching process for forming the groove G. Therefore, the bottom surface of the groove G may be the upper surface of the lower layer 120. In this regard, FIG. 7 illustrates that the lower layer 120 is positioned below each of the first to fourth grooves 1G, 2G, 3G, and 4G, and the bottom surface of each of the first to fourth grooves 1G, 2G, 3G, and 4G is coplanar with the upper surface of the lower layer 120.

The lower layer 120 may be positioned on the second interlayer-insulating layer 207 and may be formed together with the third semiconductor layer A3 (see FIG. 6) described above with reference to FIG. 6 in the same process. The lower layer 120 may include the same material as that of the third semiconductor layer A3, for example, an oxide-based semiconductor material. Like the groove G, the lower layer 120 may have a closed loop shape surrounding the opening area OA in a plan view.

When the groove G is not formed directly on the substrate 100 but formed on at least one inorganic insulating layer as in the embodiment, moisture that may be introduced through the substrate 100 may be blocked by the at least one inorganic insulating layer. In this regard, FIG. 7 illustrates a structure in which the groove G is defined on the buffer layer 201, the first gate insulating layer 203, and the first interlayer-insulating layer 205, such that the buffer layer 201, the first gate insulating layer 203, and the first interlayer-insulating layer 205 effectively block moisture that may be introduced through the substrate 100.

At least one of the grooves G may include a tip PT. According to an embodiment, as illustrated in FIG. 7, the first groove 1G, the second groove 2G, and the fourth groove 4G may each include at least one tip PT. For example, the first groove 1G may have tips PT on opposite sides with respect to a virtual vertical line passing through the center of the first groove 1G. Like the first groove 1G, the second groove 2G may also include a pair of tips PT. On the other hand, the fourth groove 4G may include one tip PT.

The tips PT may be provided in metal pattern layers 212 directly on the first organic insulating layer 211. The metal pattern layers 212 may include the same metal as the data line DL and/or the driving voltage line PL described above with reference to FIG. 6. According to an embodiment, the metal pattern layers 212 may have a three-layer structure of Ti/Al/Ti.

The metal pattern layers 212 may be on at least one side of the groove G. For example, the metal pattern layers 212 may be on opposite sides with respect to a virtual vertical line VXL passing through the center of the first groove 1G, and ends of each of the metal pattern layers 212 may protrude toward the center of the first groove 1G to define the tip PT. The tip PT is a type of eaves portion, and may pass through the inner surface of the first organic insulating layer 211 forming the inner surface of the first groove 1G and protrude the center of the first groove 1G.

Similarly, metal pattern layers 212 may be on opposite sides of the second groove 2G, and ends of each of the metal pattern layers 212 may protrude toward the center of the second groove 2G to define the tip PT.

The fourth groove 4G may include one tip PT. The tip PT may be positioned on one side of the fourth groove 4G, for example, one side adjacent to a second partition wall PW2. The metal pattern layer 212 may be positioned on one side of the fourth groove 4G, and the end of the metal pattern layer 212 may pass through the first organic insulating layer 211 forming the inner surface of the fourth groove 4G and protrude toward the center of the fourth groove 4G to define the tip PT.

Some layers included in the organic light-emitting diode OLED, for example, the first and second functional layers 222a and 222c that are the organic material layers, may be disconnected by the groove G including the tip PT. The second electrode 223 may also be disconnected or separated by the groove G including the tip PT.

In this regard, FIG. 7 illustrates that each of the first and second functional layers 222a and 222c and the second electrode 223 is disconnected and separated by the tips PT of the first groove 1G, the second groove 2G, and the fourth groove 4G in the inner non-display area MA. On the other hand, the first and second functional layers 222a and 222c and the second electrode 223 may be continuously formed without being disconnected by the third groove G3. Moisture may move toward the display area DA (see FIG. 5) through the side surface of the opening 10OP of the display panel 10, but does not move through the continuously formed organic material layers, for example, the first and second functional layers 222a and 222c. However, as illustrated in FIG. 7, because the first and second functional layers 222a and 222c are disconnected by the grooves G1, G2, G4 including the tip PT, moisture may be prevented from moving toward the display area DA (see FIG. 5).

A metal dummy stack 110 may be around the groove G. For example, metal dummy stacks 110 may be on opposite sides of the groove G. The metal dummy stack 110 is a type of mound and may increase the depth of the groove G in the z direction. According to an embodiment, FIG. 7 illustrates that the metal dummy stack 110 includes three metal layers, for example, first to third metal layers 111, 112, and 113, overlapped each other with an insulating layer therebetween in a plan view.

The first to third metal layers 111, 112, and 113 may be on the same layer and include the same material as the electrodes of the transistors and the storage capacitor described above with reference to FIG. 6. For example, the first metal layer 111 may be on the same layer and include the same material as the node connection line 166 (see FIG. 6). The second metal layer 112 may be on the same layer and include the same material as the upper gate electrode G3B, which is the sub-layer of the third gate electrode GE3. The third metal layer 113 may be on the same layer and include the same material as the upper electrode CE2 of the storage capacitor and/or the lower gate electrode G3A, which is the sub-layer of the third gate electrode GE3. Although FIG. 7 illustrates that the metal dummy stack 110 includes the three metal layers overlapping each other with the insulating layer therebetween in a plan view, the disclosure according to the invention is not limited thereto. According to another embodiment, the number of metal layers of the metal dummy stack 110 may be less than or greater than three.

Some grooves G, for example, the third groove 3G, may not include the tip PT. The third groove 3G may be used to monitor the organic encapsulation layer 320 of the encapsulation layer 300.

The organic encapsulation layer 320 may be formed by applying and curing a monomer. Because the monomer has fluidity, controlling the position of the monomer is one of the important factors in manufacturing the display panel 10. The position of the organic encapsulation layer 320 may be measured by using the amount of light reflected after being irradiated onto the display panel. Because the tip PT including a metal affects the reflectance of light used to monitor the organic encapsulation layer 320, it may be difficult to track the position of the organic encapsulation layer 320 when all the grooves G include the tip PT. However, because the display panel according to the embodiment includes the third groove 3G not having the tip PT and/or the fourth groove 4G having the tip PT only on one side thereof, the above-described problems may be prevented or minimized.

In addition to the above-described grooves G, partition walls may be positioned in the inner non-display area MA. In this regard, FIG. 7 illustrates a first partition wall PW1 and a second partition wall PW2. Grooves G including first to fourth grooves 1G to 4G may be apart from each other in the second sub-inner non-display area SMA2. The first groove 1G may be between the first partition wall PW1 and the first sub-inner non-display area SMA1. In other words, the first groove 1G may be between the first partition wall PW1 and the display area DA (see FIG. 5). The second groove 2G and the third groove 3G may be between the first partition wall PW1 and the second partition wall PW2, and the fourth groove 4G may be between the second partition wall PW2 and the opening area OA.

The grooves G between the first partition wall PW1 and the second partition wall PW2 may be covered with the organic encapsulation layer 320. In this regard, FIG. 7 illustrates that the second groove 2G and the third groove 3G are covered with the organic encapsulation layer 320 in the area between the first partition wall PW1 and the second partition wall PW2. In a comparative example in which the grooves between the first partition wall PW1 and the second partition wall PW2, for example, the second groove 2G and the third groove 3G, are not covered with the organic encapsulation layer 320, inorganic insulating layers such as the first inorganic encapsulation layer 310 and the second inorganic encapsulation layer 330 may contact each other on the second groove 2G and the third groove 3G. When the area of the contact area between the first inorganic encapsulation layer 310 and the second inorganic encapsulation layer 330 on the second groove 2G and the third groove 3G is relatively large, cracks may easily occur in the contact portions between the first inorganic encapsulation layer 310 and the second inorganic encapsulation layer 330 due to the uneven structures of the second groove 2G and the third groove 3G themselves. The cracks may deteriorate the quality of the display panel 10. However, according to the embodiment, because the organic encapsulation layer 320 covers the grooves G between the first partition wall PW1 and the second partition wall PW2, for example, the second groove 2G and the third groove 3G, the above-described problems may be prevented or minimized.

The first inorganic encapsulation layer 310 of the encapsulation layer 300 may continuously cover the inner surfaces of the grooves G, and the organic encapsulation layer 320 may cover the first sub-inner non-display area SMA1 and may cover a portion of the second sub-inner non-display area SMA2. The organic encapsulation layer 320 may cover some grooves G, for example, the first groove 1G and the second and third grooves 2G and 3G between the first and second partition walls PW1 and PW2. The second inorganic encapsulation layer 330 may completely cover the inner non-display area MA on the organic encapsulation layer 320.

The first partition wall PW1 may include a plurality of protrusions so as to control the flow of the monomer when the organic encapsulation layer 320 is formed. According to an embodiment, FIG. 7 illustrates that the first partition wall PW1 includes first to third protrusions 1141, 1142, and 1143 apart from each other.

The organic encapsulation layer 320 may be discontinuous in the inner non-display area MA due to the structure of the first partition wall PW1 or the like. For example, as illustrated in FIGS. 6 and 7, a portion of the organic encapsulation layer 320 may cover the display area DA and the first sub-inner non-display area SMA1, and another portion thereof may cover an area between the first partition wall PW1 and the second partition wall PW2. A portion of the second inorganic encapsulation layer 330 on the third protrusion 143 of the first partition wall PW1, which is a discontinuous point of the organic encapsulation layer 320, may be in direct contact with a portion of the first inorganic encapsulation layer 310.

The end of the organic encapsulation layer 320 may be positioned on one side of the second partition wall PW2 and may not extend toward the opening area OA through the second partition wall PW2. Therefore, a portion of the second inorganic encapsulation layer 330 may be in direct contact with a portion of the first inorganic encapsulation layer 310 on the upper surface of the second partition wall PW2. The second inorganic encapsulation layer 330 may be in direct contact with the first inorganic encapsulation layer 310 between the second partition wall PW2 and the opening area OA.

The touch insulating layers described above with reference to FIG. 6 may extend to the inner non-display area MA. In this regard, FIG. 7 illustrates a structure in which the first to third touch insulating layers 401, 403, and 405 extend to the inner non-display area MA.

The planarization layer 450 may be positioned in the inner non-display area MA. The planarization layer 450 may planarize the inner non-display area MA. The planarization layer 450 may cover a structure that is positioned in the inner non-display area MA, but is provided under the planarization layer 450.

Referring to FIGS. 6 and 7, the planarization layer 450 may be positioned only in the inner non-display area MA and may not exist in the display area DA (see FIG. 6). In this regard, FIG. 6 illustrates that an outer edge 450e of the planarization layer 450 is not positioned in the display area DA. The process of forming the planarization layer 450 may be performed between the process of forming the first touch insulating layer 401 and the process of forming the second touch insulating layer 403. Therefore, the first touch insulating layer 401 and the second touch insulating layer 403 may be in direct contact with each other in the display area DA adjacent to the outer edge 450e of the planarization layer 450.

Referring to the opening area OA of FIG. 7, the display panel 10 includes an opening 10OP. The opening 10OP of the display panel 10 may include openings of elements constituting the display panel 10. For example, the opening 10OP of the display panel 10 may include an opening 100OP of the substrate 100, openings 310OP and 330OP of the first and second inorganic encapsulation layers 310 and 330 of the encapsulation layer 300, and an opening 450OP of the planarization layer 450.

The openings of the elements constituting the display panel 10 may be formed at the same time. Therefore, an inner surface 100IS of the substrate 100 defining the opening 100OP of the substrate 100 and an inner surface 450IS of the planarization layer 450 defining the opening 450OP of the planarization layer 450 may be positioned on the same vertical line.

FIGS. 8 to 11 are cross-sectional views for describing a method of manufacturing a display panel, according to an embodiment. FIGS. 8 to 11 illustrate cross-sections of an inner non-display area MA and an opening area OA according to a process of manufacturing the display panel.

Figure 8:
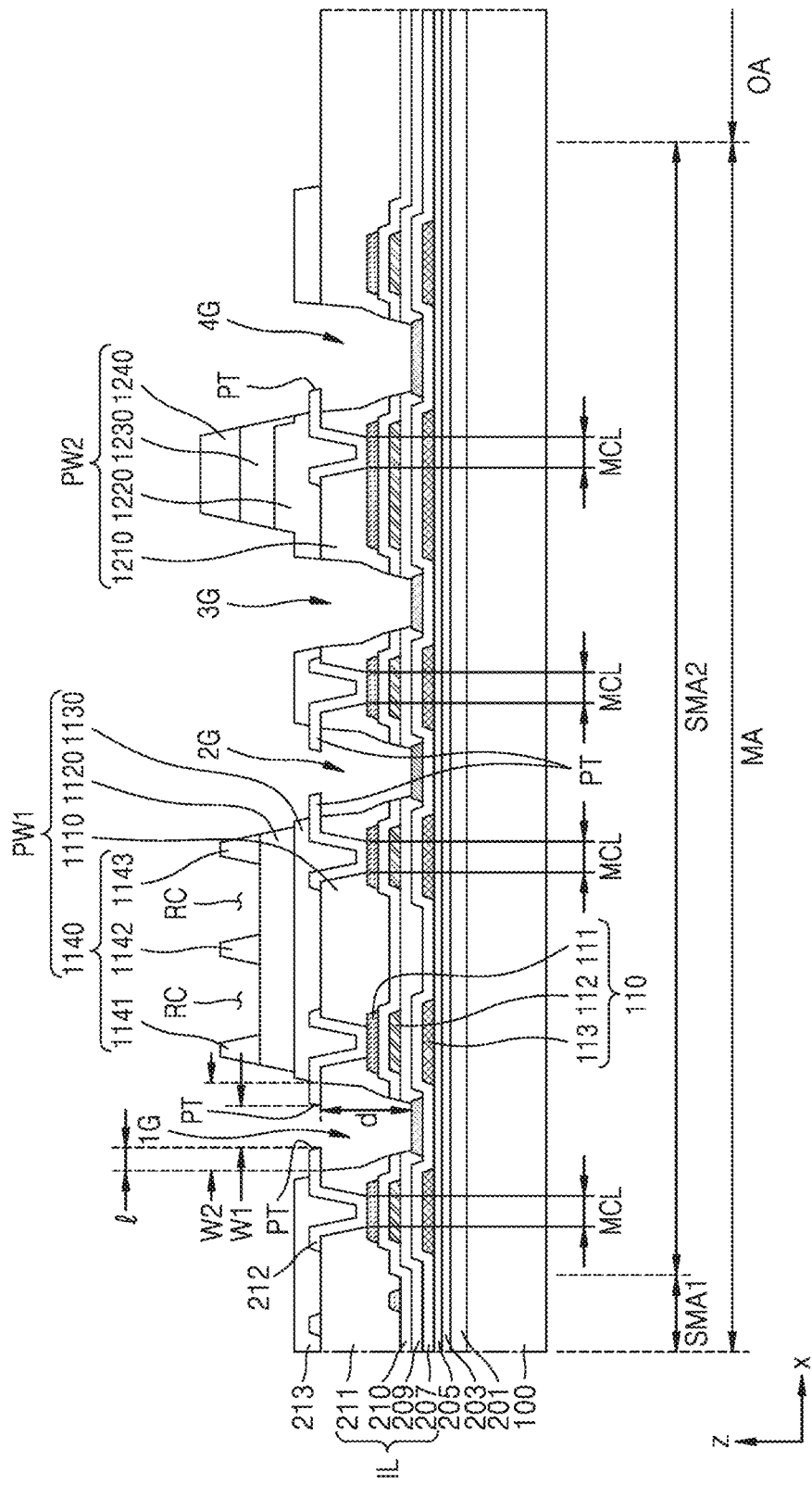
FIGS. 8 to 11 are cross-sectional views for describing a method of manufacturing a display panel, according to an embodiment.

Referring to FIG. 8, first to fourth grooves 1G, 2G, 3G, and 4G and first and second partition walls PW1 and PW2 may be formed in an inner non-display area MA, for example, a second sub-inner non-display area SMA2.

The first to fourth grooves 1G, 2G, 3G, and 4G may pass through at least one insulating layer. For example, the first to fourth grooves 1G, 2G, 3G, and 4G may pass through an insulating layer stack IL including a second gate insulating layer 209, a third interlayer-insulating layer 210, and a first organic insulating layer 211. Each of the first to fourth grooves 1G, 2G, 3G, and 4G may be formed by etching portions of the first organic insulating layer 211, the third interlayer-insulating layer 210, and the second gate insulating layer 209. In this case, a lower layer 120 may be an etch stopper. The lower surface of each of the first to fourth grooves 1G, 2G, 3G, and 4G may correspond to the upper surface of the lower layer 120.

Some grooves, for example, the first groove 1G, the second groove 2G, and the fourth groove 4G, may include tips PT. The first groove 1G and the second groove 2G may each include two tips PT protruding toward each other, and the fourth groove 4G may include one tip PT.

The tip PT is an end portion of the metal pattern layer 212 directly above the first organic insulating layer 211 and may protrude toward the center of the corresponding groove.

The tip PT of the first groove 1G may protrude toward the center of the first groove 1G by a first length l in the x direction while passing through the inner surface of the first organic insulating layer 211 defining the inner surface of the first groove 1G. Therefore, a horizontal distance W1 between the tips PT facing each other may be less than a width W2 of the inner surface of the first organic insulating layer 211 in the x direction. The first length l of the tip PT in the x direction may have a value less than a depth d of a groove to be described later. According to an embodiment, the first length l of the tip PT may be less than about 2 micrometers (μm).

Like the first groove 1G, the second groove 2G may include two tips PT facing each other. Unlike the first groove 1G, the fourth groove 4G may include one tip PT protruding toward the center of the fourth groove 4G.

Metal dummy stacks 110 may be around the first to fourth grooves 1G, 2G, 3G, and 4G. The metal dummy stacks 110 may be on opposite sides of a virtual vertical line VXL passing through the first to fourth grooves 1G, 2G, 3G, and 4G. The metal dummy stack 110 is a type of mound including metal layers overlapping each other with an insulating layer therebetween in a plan view. The metal dummy stack 110 may increase the depth d of each of the first to fourth grooves 1G, 2G, 3G, and 4G. The depth d may be about 2.5 μm to about 3 μm in the z direction.

The metal dummy stack 110 may include first to third metal layers 111, 112, and 113, and materials of the first to third metal layers 111, 112, and 113 are as the same as described above with reference to FIG. 7.

The metal pattern layer 212 may be in direct contact with the uppermost layer of the metal dummy stack 110, for example, the first metal layer 111. The metal pattern layer 212 may be in direct contact with the upper surface of the first metal layer 111 through a hole 211H of the first organic insulating layer 211. Metal contact areas MCL formed by the direct contact between the metal pattern layer 212 and the metal dummy stack 110 may be adjacent to the grooves. For example, the metal contact areas MCL may be on opposite sides of the first and second grooves 1G and 2G, and the metal contact areas MCL may be on one side of each of the third and fourth grooves 3G and 4G. In this manner, at least one metal contact area MCL may be between the adjacent grooves. By forming the metal contact area MCL in the thickness direction (i.e., z direction) of the first organic insulating layer 211, the progress of moisture through the first organic insulating layer 211 may be blocked.

The first partition wall PW1 may be between the first groove 1G and the second groove 2G. The first partition wall PW1 may include first to fourth sub-partition wall layers 1110, 1120, 1130, and 1140. The first to fourth sub-partition wall layers 1110, 1120, 1130, and 1140 may include the same materials as those of the first organic insulating layer 211, the second organic insulating layer 213, the bank layer 215, and the spacer 217, respectively.

The first partition wall PW1 may include a plurality of protrusions thereon. As one example, FIG. 8 illustrates first to third protrusions 1141, 1142, and 1143. The first to third protrusions 1141, 1142, and 1143 may be formed on the fourth sub-partition wall layer 1140. Therefore, the first to third protrusions 1141, 1142, and 1143 may include the same material as the material of the spacer 217.

Recesses RC may be formed between the adjacent protrusions among the first to third protrusions 1141, 1142, and 1143. The depth of the recesses RC in the z direction may correspond to the height of the first to third protrusions 1141, 1142, and 1143. The structure including the first to third protrusions 1141, 1142, and 1143 and the recesses RC may control the flow of a monomer forming an organic encapsulation layer MN in a process to be described later.

The second partition wall PW2 may be apart from the first partition wall PW1 and may be between the first partition wall PW1 and the opening area OA. The second partition wall PW2 may include first to fourth sub-partition wall layers 1210, 1220, 1230, and 1240. The first to fourth sub-partition wall layers 1210, 1220, 1230, and 1240 may include the same materials as those of the first organic insulating layer 211, the second organic insulating layer 213, the bank layer 215, and the spacer 217, respectively.

The second partition wall PW2 may be on the metal dummy stack 110. A height H2 of the second partition wall PW2 may be equal to or greater than a height H1 of the first partition wall PW1 in the z direction. According to an embodiment, FIG. 8 illustrates that the height H2 of the second partition wall PW2 is greater than the height H1 of the first partition wall PW1. Each of the first partition wall PW1 and the second partition wall PW2 may have a closed loop shape that completely surrounds the opening area OA in a plan view. Because the first partition wall PW1 has a closed loop shape that completely surrounds the opening area OA in a plan view, the first to third protrusions 1141, 1142, and 1143 may also have a closed loop shape that completely surrounds the opening area OA in a plan view.

Figure 9:
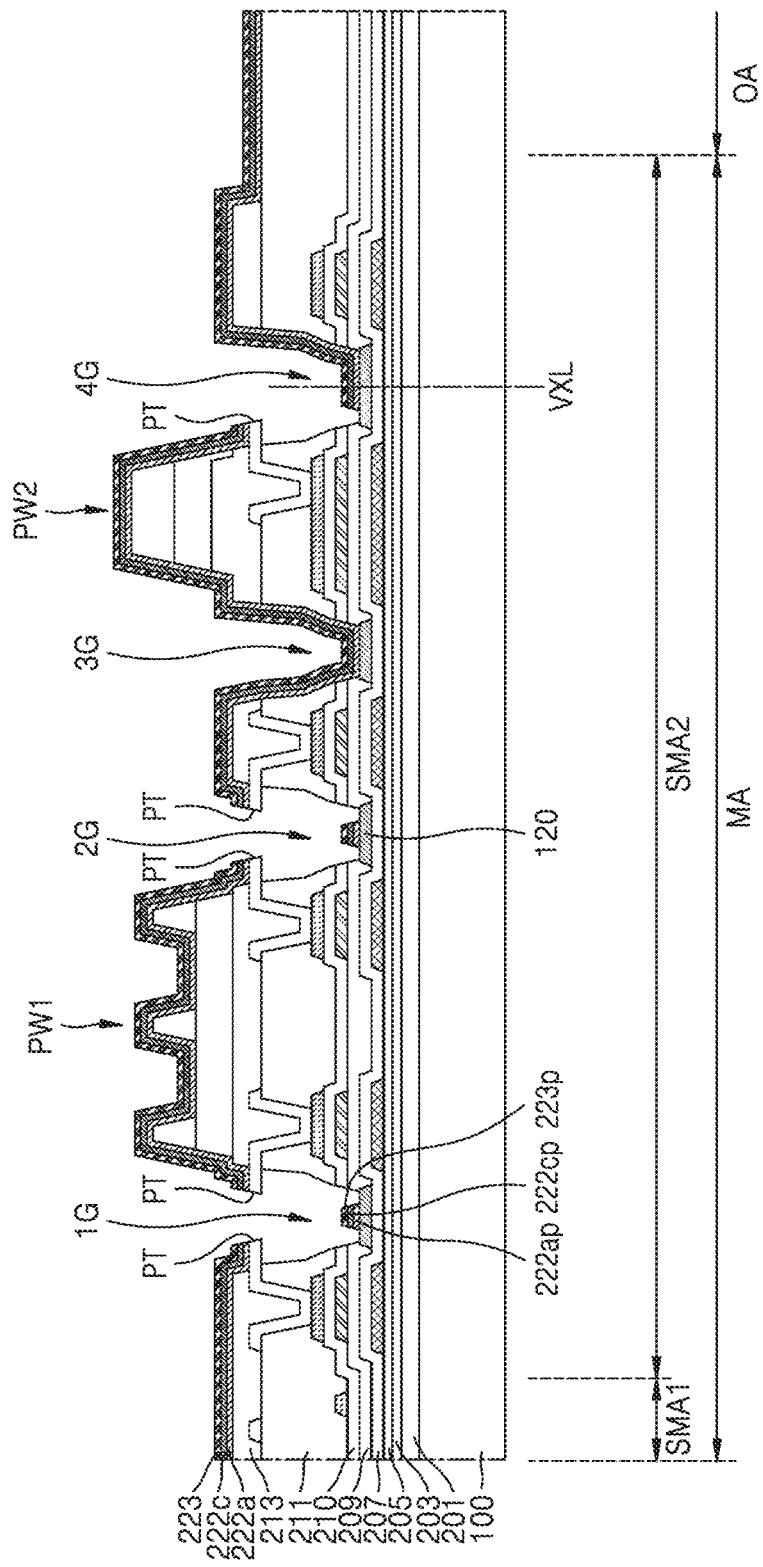

Referring to FIG. 9, first and second functional layers 222a and 222c and a second electrode 223 of an organic light-emitting diode may be formed on the substrate 100 on which the first to fourth grooves 1G, 2G, 3G, and 4G and the first and second partition walls PW1 and PW2 are formed. The first and second functional layers 222a and 222c and the second electrode 223 may be formed through a thermal evaporation process. As described above with reference to FIG. 6, each of the first and second functional layers 222a and 222c and the second electrode 223 may also be deposited in the inner non-display area MA. However, because each of the first groove 1G, the second groove 2G, and the fourth groove 4G formed in the inner non-display area MA includes a tip PT having an eave structure, each of the first and second functional layers 222a and 222c and the second electrode 223 may be disconnected in the tip PT.

In this regard, FIG. 9 illustrates the first functional layer 222a, which is arranged on the bottom surface of each of the first groove 1G and the second groove 2G and is placed on the tip PT, and a discontinuous portion 222ap of the first functional layer 222a. Similarly, a portion 222cp of the second functional layer 222c and a portion 223p of the second electrode 223 on the bottom surface of each of the first groove 1G and the second groove 2G may be discontinuous with the second functional layer 222c and the second electrode 223 placed on the tip PT.

Because the third groove 3G does not include the tip PT, the first and second functional layers 222a and 222c and the second electrode 223 may continuously cover the inner surface of the third groove 3G.

The fourth groove 4G may include one tip PT, and the first and second functional layers 222a and 222c and the second electrode 223 may be disconnected under the tip PT. Based on the virtual vertical line VXL passing through the center of the fourth groove 4G, the inner surface of the fourth groove 4G on which the tip PT is not formed may be covered with the first and second functional layers 222a and 222c and the second electrode 223.

Figure 10:
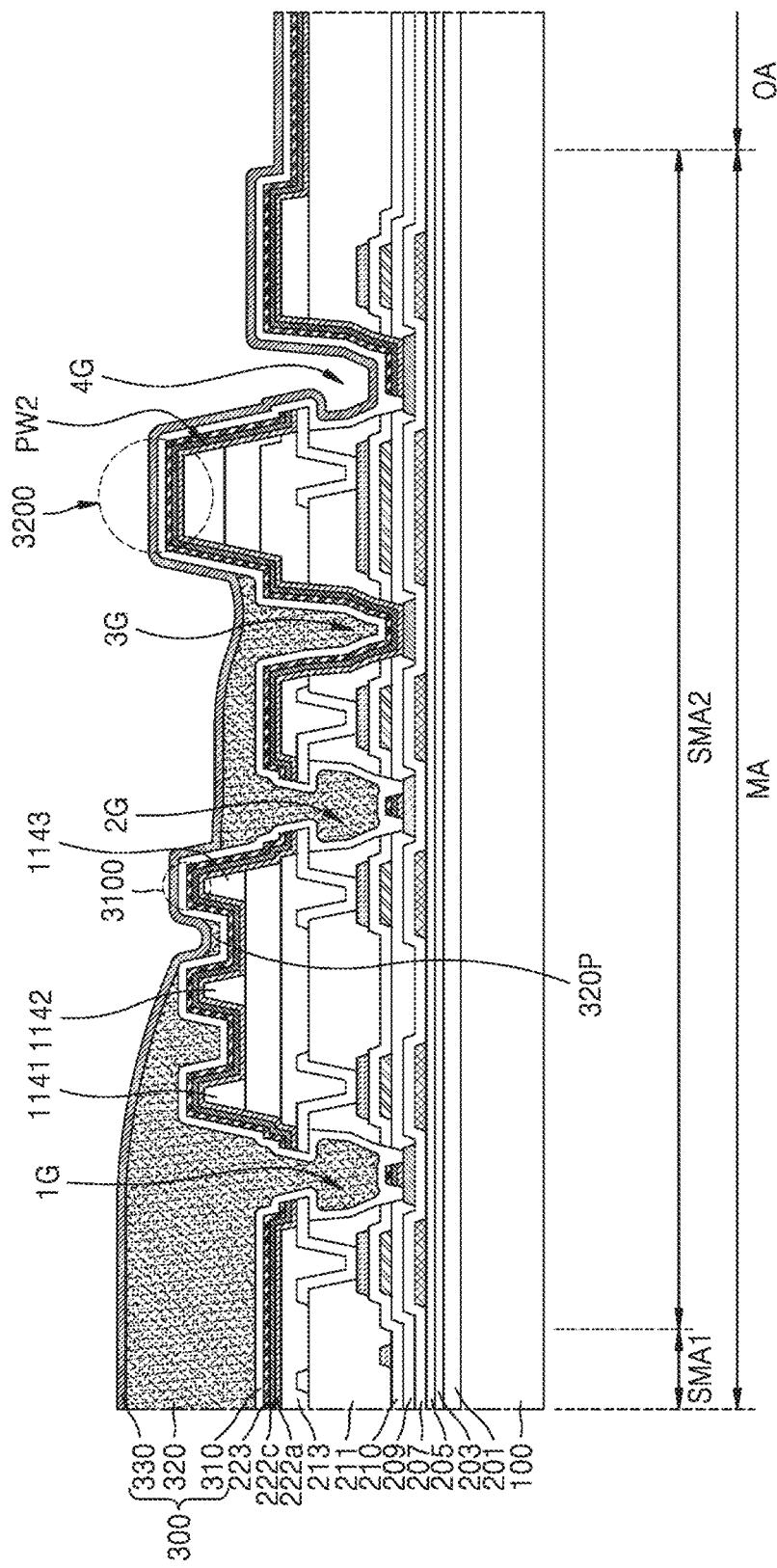

Referring to FIG. 10, an encapsulation layer 300 may be formed. Because the first inorganic encapsulation layer 310 is formed through chemical vapor deposition and has relatively excellent step coverage, the first inorganic encapsulation layer 310 may continuously cover the inner surfaces of the first to fourth grooves 1G, 2G, 3G, and 4G. When the tip PT is formed in the groove, the first inorganic encapsulation layer 310 may also continuously cover the lower surface of the tip PT. The first inorganic encapsulation layer 310 may also continuously cover the side surface and the upper surface of the first partition wall PW1, and may also continuously cover the side surface and the upper surface of the second partition wall PW2.

An organic encapsulation layer 320 may be formed by applying and curing a monomer. The monomer may be applied in an inkjet method. The monomer may be applied such that a portion of the monomer exists between the first partition wall PW1 and the second partition wall PW2, and the flow of the monomer may be controlled by the first to third protrusions 1141, 1142, and 1143 positioned above the first partition wall PW1. The monomer may exist in the recess RC (see FIG. 8) between the adjacent protrusions among the first to third protrusions 1141, 1142, and 1143. As the monomer in the recess RC is cured, a portion 320P of the organic encapsulation layer 320 may be positioned in the recess RC (see FIG. 8).

In a case that the amount of the monomer in the recess RC (see FIG. 8) exceeds the allowable limit of the recess RC (see FIG. 8), the monomer may move between the first partition wall PW1 and the second partition wall PW2. Therefore, it is difficult for the monomer to exist on the upper surface of the protrusion of the first partition wall PW1, for example, the third protrusion 1143, which is close to the second partition wall PW2. Therefore, a portion of the second inorganic encapsulation layer 330 formed after the organic encapsulation layer 320 may be in direct contact with a portion of the first inorganic encapsulation layer 310 on the first partition wall PW1, for example, the third protrusion 1143. In this regard, FIG. 10 illustrates that an inorganic contact area (hereinafter, referred to as a first inorganic contact area 3100) in which a portion of the second inorganic encapsulation layer 330 is in direct contact with a portion of the first inorganic encapsulation layer 310 exists on a portion of the upper surface of the first partition wall PW1.

The inorganic contact area formed by the direct contact between the second inorganic encapsulation layer 330 and the first inorganic encapsulation layer 310 may also exist on the second partition wall PW2. The organic encapsulation layer 320 does not extend toward the opening area OA through the second partition wall PW2, and a portion of the second inorganic encapsulation layer 330 on the upper surface of the second partition wall PW2 may be in direct contact with a portion of the first inorganic encapsulation layer 310 to form a second inorganic contact area 3200.

A portion of the organic encapsulation layer 320 may exist in the first groove 1G, the second groove 2G, and the third groove 3G. On the other hand, a material corresponding to the organic encapsulation layer 320 does not exist in the fourth groove 4G closer to the opening area OA than the second partition wall PW2, and the second inorganic encapsulation layer 330 may be in contact with the first inorganic encapsulation layer 310 and the inner surface of the fourth groove 4G.

Figure 11:
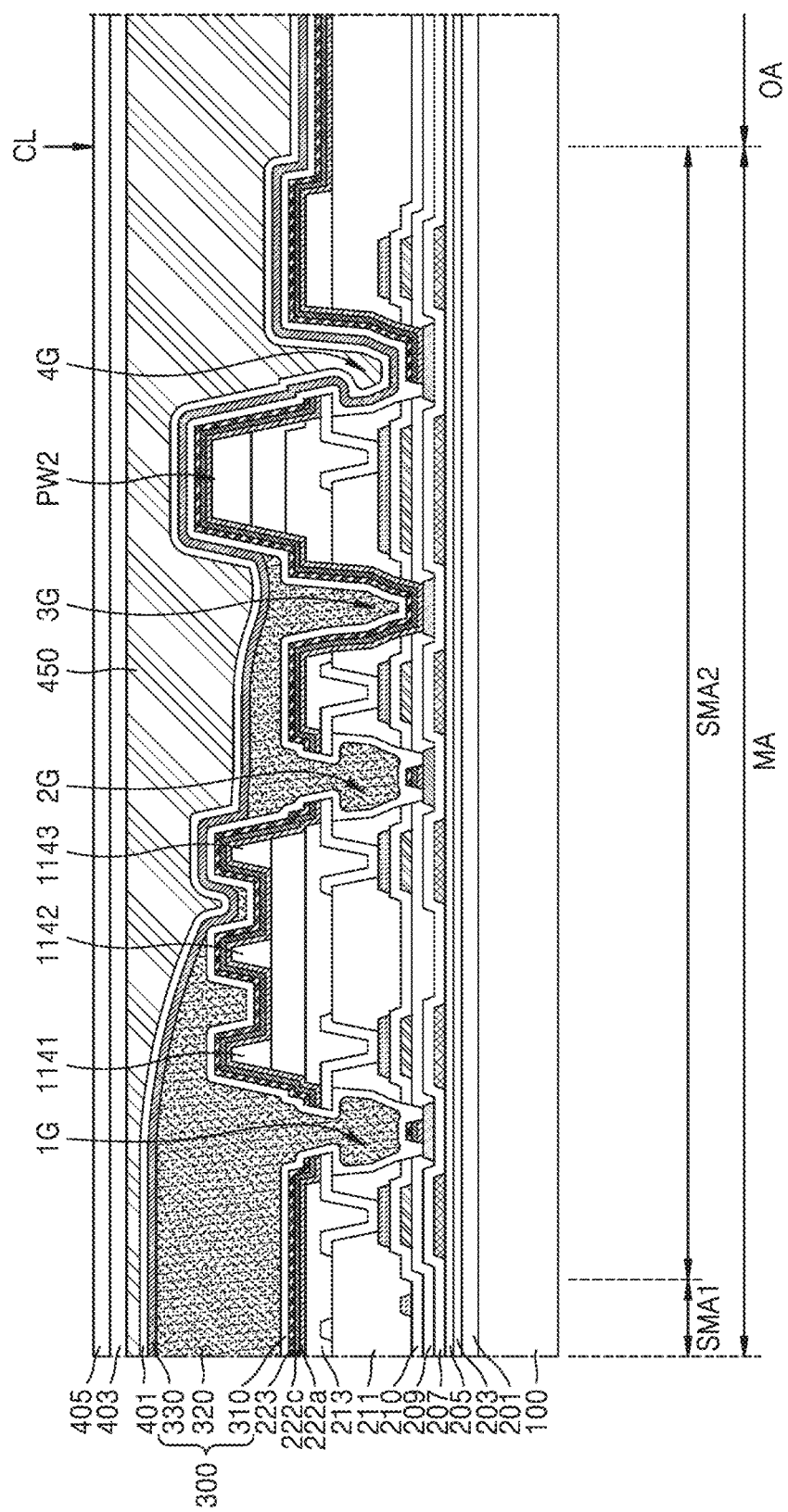

Referring to FIG. 11, a first touch insulating layer 401, a planarization layer 450, a second touch insulating layer 403, and a third touch insulating layer 405 may be formed on the encapsulation layer 300. A portion of the planarization layer 450 may exist in the fourth groove 4G. Although not illustrated in FIG. 11, a first conductive layer 402 (see FIG. 6) may be formed between the first touch insulating layer 401 and the second touch insulating layer 403, and a second conductive layer 404 (see FIG. 6) may be formed between the second touch insulating layer 403 and the third touch insulating layer 405.

When the elements positioned in the opening area OA along a cutting line CL are removed by using a laser beam or the like, an opening 10OP of the display panel 10 may be formed in the opening area OA, as illustrated in FIG. 7.

Figure 12:
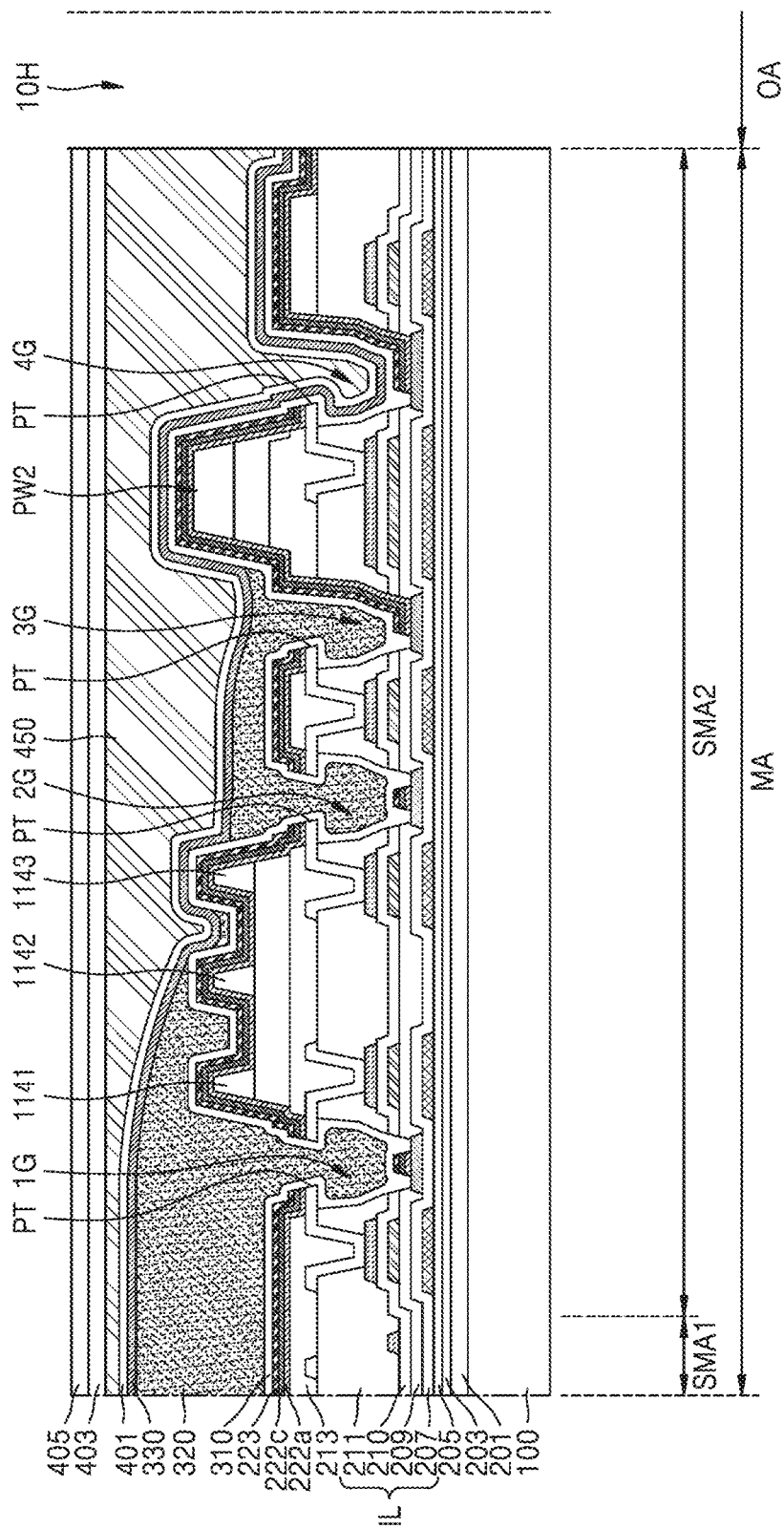
FIG. 12 is a cross-sectional view illustrating an inner non-display area and an opening area of a display panel, according to another embodiment.

FIG. 12 is a cross-sectional view illustrating an inner non-display area and an opening area of a display panel, according to another embodiment.

Referring to FIG. 12, a third groove 3G may include a tip PT at one side like a fourth groove 4G, and other features are the same as described above with reference to FIGS. 7 to 11.

Because the third groove 3G includes the tip PT like the fourth groove 4G, first and second functional layers 222a and 222c and a second electrode 223 may be disconnected or separated. Because one side of each of the third groove 3G and the fourth groove 4G does not include the tip PT, a position of an organic encapsulation layer 320 may be easily monitored.

Figure 13:
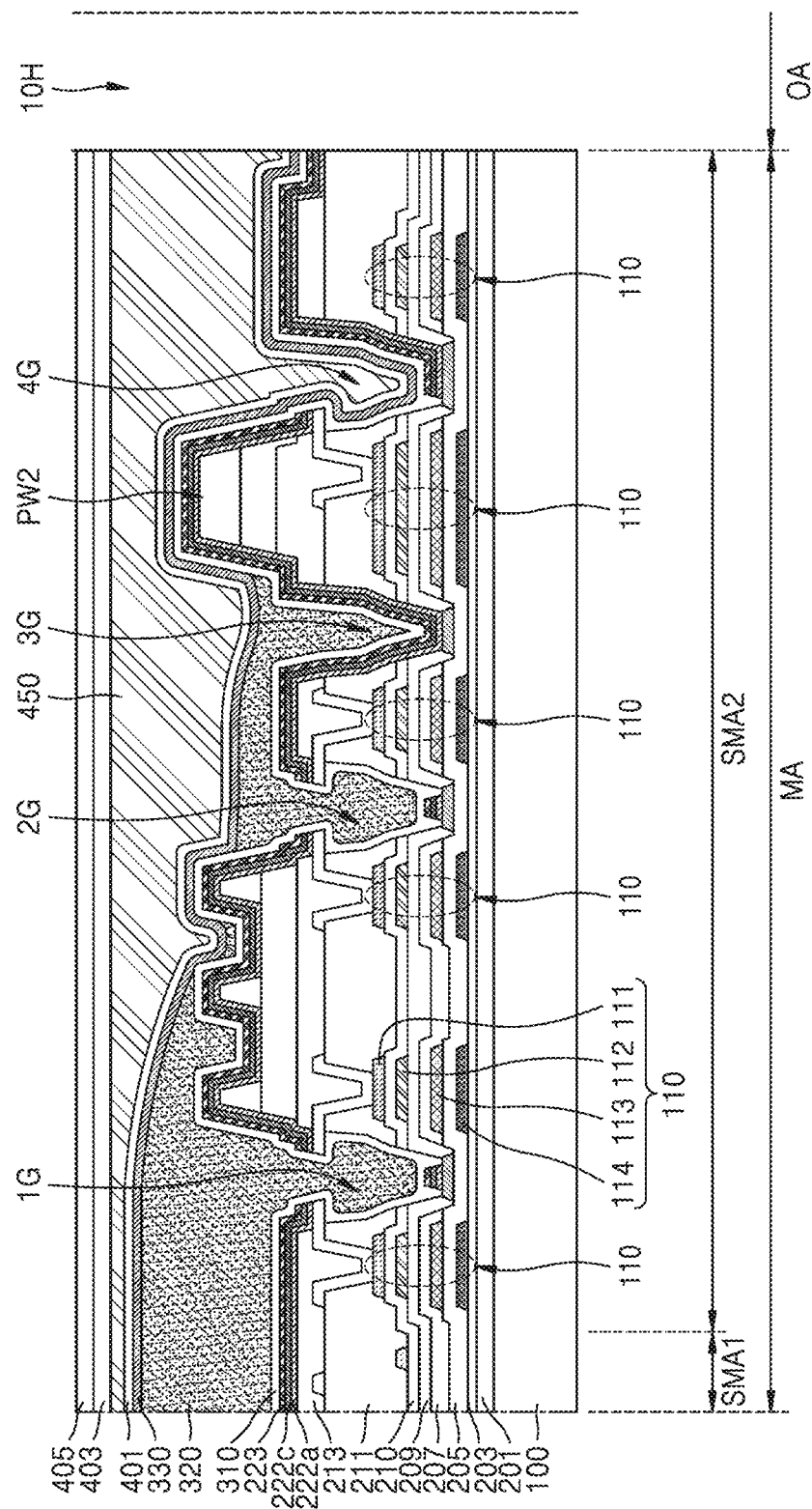
FIG. 13 is a cross-sectional view illustrating an inner non-display area and an opening area of a display panel, according to still another embodiment.

FIG. 13 is a cross-sectional view illustrating an inner non-display area and an opening area of a display panel, according to still another embodiment. Although FIGS. 7 to 11 illustrate that the metal dummy stack 110 of the display panel includes the first to third metal layers 111, 112, and 113 overlapping each other with the insulating layers therebetween in a plan view, the disclosure according to the invention is not limited thereto. According to another embodiment, referring to FIG. 13, a metal dummy stack 110 may include first to fourth metal layers 111, 112, 113, and 114 overlapping each other with insulating layers therebetween in a plan view.

The first metal layer 111 may be on the same layer and include the same material as the node connection line 166 (see FIG. 6). The second metal layer 112 may be on the same layer and include the same material as the upper gate electrode G3B, which is the sub-layer of the third gate electrode GE3 (see FIG. 6). The third metal layer 113 may be on the same layer and include the same material as the upper electrode CE2 (see FIG. 6) of the storage capacitor and/or the lower gate electrode G3A (see FIG. 6), which is the sub-layer of the third gate electrode GE3. The fourth metal layer 114 may include the same material as the first gate electrode GE1 and/or the lower electrode CE1 (see FIG. 6) of the storage capacitor.

Although FIG. 13 illustrates that the metal dummy stack 110 includes four metal layers, the disclosure according to the invention is not limited thereto. According to another embodiment, the metal dummy stack 110 may include one or more metal layers selected from the first to fourth metal layers 111, 112, 113, and 114 illustrated in FIG. 13.

Figure 14:
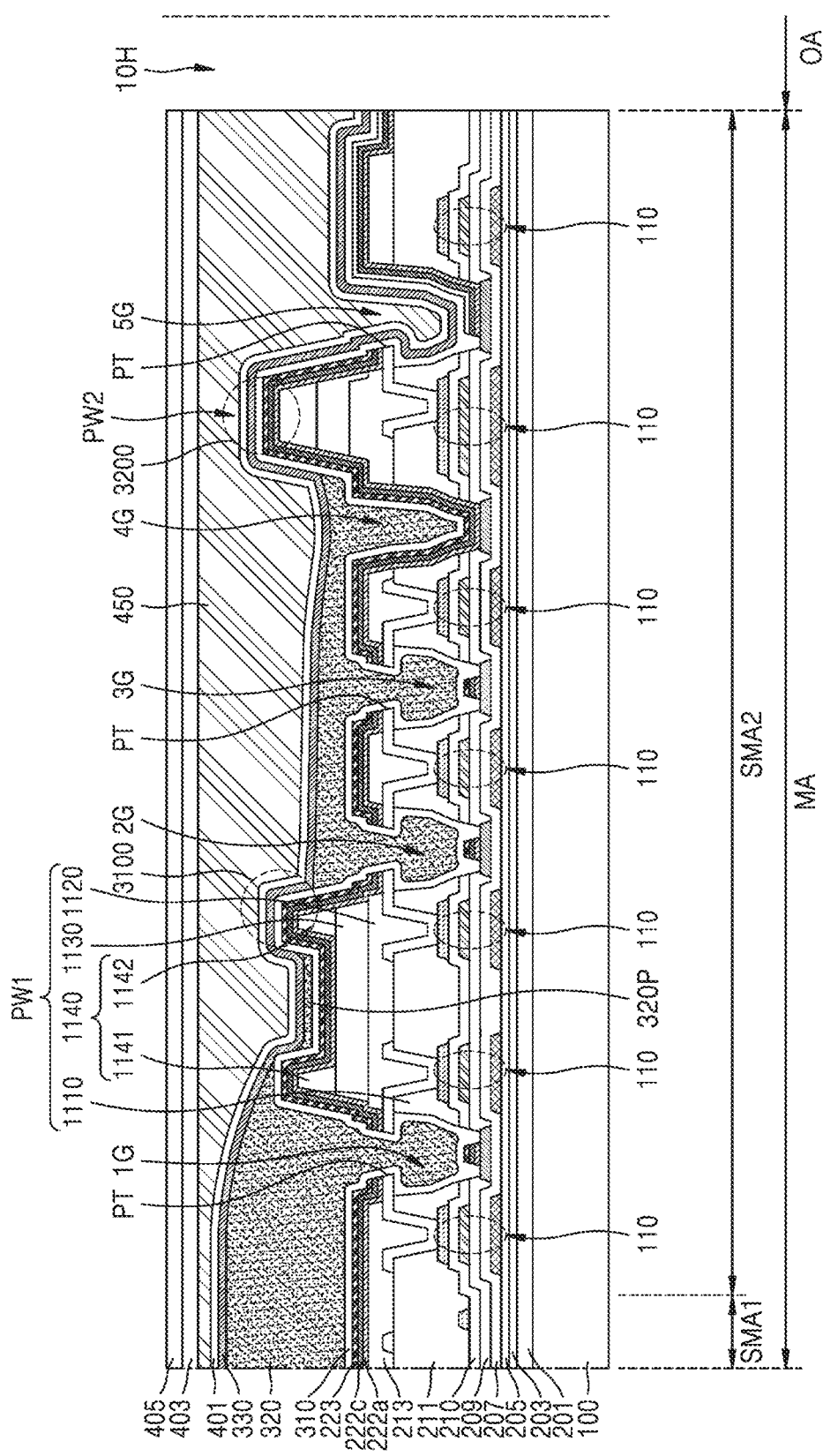
FIG. 14 is a cross-sectional view illustrating an inner non-display area and an opening area of a display panel, according to yet another embodiment.

FIG. 14 is a cross-sectional view illustrating an inner non-display area and an opening area of a display panel, according to yet another embodiment.

FIG. 14 illustrates that the display panel includes three grooves between a first partition wall PW1 and a second partition wall PW2, and the first partition wall PW1 includes two protrusions. Because other features are the same as described above with reference to FIGS. 7 to 11, the following description will be given focusing on the differences.

Referring to FIG. 14, a plurality of grooves may be in an inner non-display area MA, for example, a second sub-inner non-display area SMA2. In this regard, FIG. 14 illustrates that first to fifth grooves 1G, 2G, 3G, 4G, and 5G are apart from each other.

The first groove 1G is adjacent to a first sub-inner non-display area SMA1. For example, the first groove 1G may be between the first sub-inner non-display area SMA1 and a first partition wall PW1. The second, third, and fourth grooves 2G, 3G, and 4G may be between the first partition wall PW1 and the second partition wall PW2, and the fifth groove 5G may be between the second partition wall PW2 and an opening area OA.

The first groove 1G may include two tips PT, and first and second functional layers 222a and 222c and a second electrode 223 may be disconnected by the tips PT. Of grooves between the first partition wall PW1 and the second partition wall PW2, a groove adjacent to the second partition wall PW2, for example, the fourth groove 4G may not include the tip PT. In this case, as described above, the fourth groove 4G may be used to monitor an organic encapsulation layer 320. The fifth groove 5G may include the tip PT positioned on one side thereof, and the other side of the fifth groove 5G may not include the tip PT.

The organic encapsulation layer 320 may cover portions of the first sub-inner non-display area SMA1 and the second sub-inner non-display area SMA2 of the inner non-display area MA. For example, like the display panel described above with reference to FIG. 7, the organic encapsulation layer 320 may cover grooves between the first sub-inner non-display area SMA1 and the first partition wall PW1, and between the first partition wall PW1 and the second partition wall PW2. In this regard, FIG. 14 illustrates that the first to fourth grooves 1G, 2G, 3G, and 4G are covered with the organic encapsulation layer 320.

In the same manner as described above with reference to FIGS. 7 and 8, the first partition wall PW1 may include first to fourth sub-partition wall layers 1110, 1120, 1130, and 1140. The first partition wall PW1 may include at least one recess defined in the fourth sub-partition wall layer 1140 and protrusions disposed on opposite sides of the at least one recess. In this regard, FIG. 14 illustrates first and second protrusions 1141 and 1142 and one recess therebetween.

As described above with reference to FIGS. 7 and 10, a portion 320P of the organic encapsulation layer 320 may exist in the recess, and the first inorganic contact area 3100 in which the first inorganic encapsulation layer 310 and the second inorganic encapsulation layer 330 are in direct contact with each other may be disposed on one of the protrusions of the first partition wall PW1, for example, the second protrusion 1142. Similarly, the second inorganic contact area 3200 may be disposed on the second partition wall PW2 as well.

Although FIG. 14 illustrates that the metal dummy stack 110 includes the three metal layers apart from each other with the insulating layer therebetween, the disclosure according to the invention is not limited thereto. As illustrate in FIG. 13, according to another embodiment, the metal dummy stack 110 may include four metal layers apart from each other with an insulating layer therebetween, or may include one or more metal layers selected from the aforementioned four metal layers.

Figure 15:
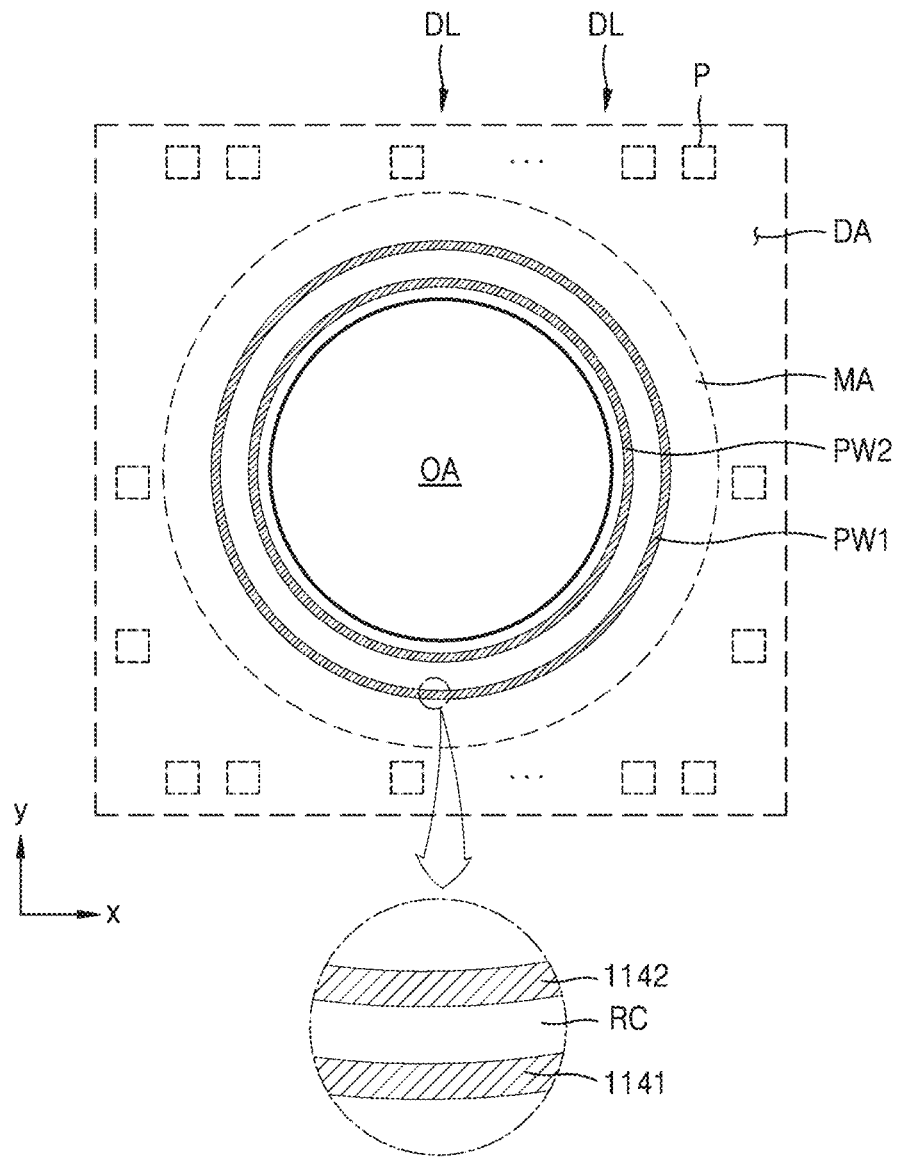
FIG. 15 is a plan view of a portion of a display panel, according to an embodiment.

FIG. 15 is a plan view of a portion of a display panel, according to an embodiment.

FIG. 15 illustrates first and second partition walls PW1 and PW2 in an inner non-display area MA. Each of the first and second partition walls PW1 and PW2 may have a closed loop shape that completely surrounds the opening area OA in the inner non-display area MA. As described above, an opening 10OP of the display panel and an opening 100OP of a substrate 100 may be defined in an opening area OA. Therefore, in the present specification, the opening area OA may be used interchangeably with the opening 10OP of the display panel 10 and/or the opening 100OP of the substrate 100. For example, that the first and second partition walls PW1 and PW2 surround the opening area OA may mean that the first and second partition walls PW1 and PW2 surround the opening 10OP of the display panel 10. Alternatively, that the first and second partition walls PW1 and PW2 surround the opening area OA may mean that the first and second partition walls PW1 and PW2 surround the opening 100OP of the substrate 100.

As described above, the first partition wall PW1 may include protrusions. Like the first partition wall PW1, the protrusions and recesses provided on the first partition wall PW1 may have a closed loop shape that surrounds the opening area OA. In this regard, referring to an enlarged view of FIG. 15, the first partition wall PW1 may include a first protrusion 1141, a second protrusion 1142, and a recess RC therebetween. Each of the first protrusion 1141, the second protrusion 1142, and the recess RC may have a closed loop shape that surrounds the opening area OA.

Figure 16:
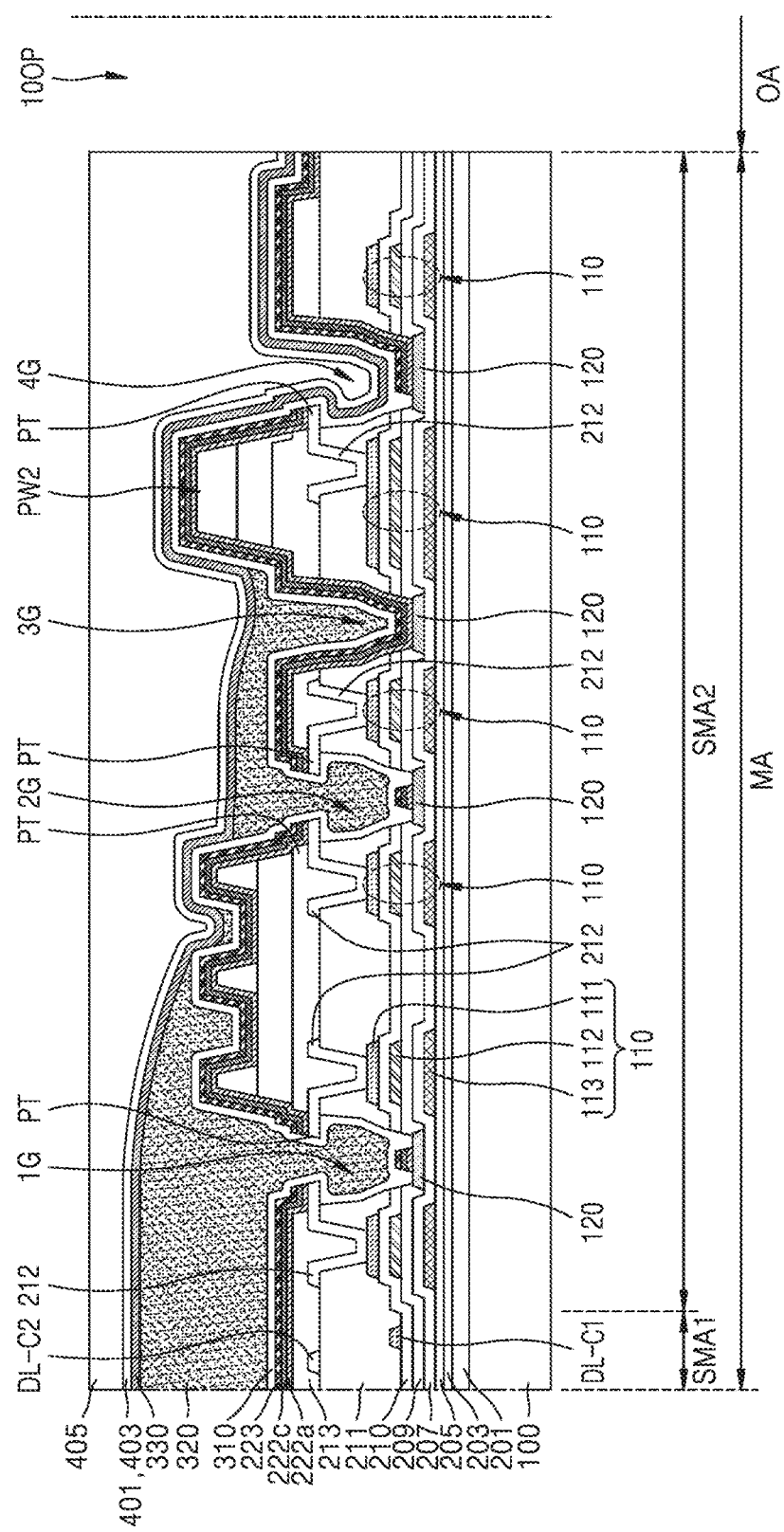
FIG. 16 is a cross-sectional view illustrating an inner non-display area and an opening area of a display panel, according to another embodiment.

FIG. 16 is a cross-sectional view illustrating an inner non-display area and an opening area of a display panel, according to another embodiment.

According to the embodiment described above with reference to FIGS. 7 to 14, the planarization layer 450 (see FIGS. 7 and 14) is illustrated as being disposed between the first touch insulating layer 401 and the second touch insulating layer 403 and positioned only in the inner non-display area MA, but the disclosure according to the invention is not limited thereto. According to another embodiment, a third touch insulating layer 405 including an organic insulating material may function as a planarization layer.

In this case, the second inorganic encapsulation layer 330, the first touch insulating layer 401, and the second touch insulating layer 403 may be between the organic encapsulation layer 320 and the third touch insulating layer 405.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
    a substrate defining an opening therein;
    a plurality of light-emitting diodes in a display area surrounding the opening, wherein one of the plurality of light-emitting diodes includes a first electrode, a second electrode, an emission layer between the first electrode and the second electrode;
    an encapsulation layer on the plurality of light-emitting diodes, the encapsulation layer comprising at least one inorganic encapsulation layer and at least one organic encapsulation layer;
    a first partition wall and a second partition wall in a non-display area between the opening and the display area, the first partition wall and the second partition wall being arranged in a direction from the display area to the opening;
    a plurality of grooves defined above at least one inorganic insulating layer in the non-display area, the at least one inorganic insulating layer being on the substrate and
    at least one organic layer interposed between the first electrode and the second electrode in the display area,
    wherein at least one of the plurality of grooves is defined between the first partition wall and the second partition wall and is covered with the organic encapsulation layer,
    wherein the at least one organic layer extends to the non-display area and is disconnected by at least one of the plurality of grooves.

2. The display panel of claim 1, wherein a lower layer is below each of the plurality of grooves, and
    an upper surface of the lower layer corresponds to a bottom surface of each of the plurality of grooves.

3. The display panel of claim 2, wherein each of the plurality of light-emitting diodes is connected to a sub-pixel circuit on the substrate, and the sub-pixel circuit comprises a thin-film transistor including a silicon-based semiconductor layer and a thin-film transistor including an oxide-based semiconductor layer.

4. The display panel of claim 3, wherein the lower layer includes a same material as a material of the oxide-based semiconductor layer.

5. The display panel of claim 1, wherein the plurality of grooves comprises two or more grooves between the first partition wall and the second partition wall,
    a first groove adjacent to the first partition wall among the two or more grooves comprises a pair of tips protruding toward a center of the first groove and overlapping the organic encapsulation layer in a plan view, and
    a second groove adjacent to the second partition wall among the two or more grooves does not comprise a tip on at least one of opposite sides of a virtual vertical line passing through a center of the second groove.

6. The display panel of claim 5, wherein
    the second electrode extends to the non-display area and disconnected or separated by the pair of tips of the first groove in the non-display area.

7. The display panel of claim 6, wherein the functional layer and the second electrode continuously extend along an inner surface of the second groove.

8. The display panel of claim 1, wherein the first partition wall comprises a plurality of protrusions and a recess between adjacent protrusions among the plurality of protrusions.

9. The display panel of claim 8, wherein a portion of the organic encapsulation layer is in the recess.

10. The display panel of claim 9, wherein the at least one inorganic encapsulation layer comprises:
    a first inorganic encapsulation layer below the organic encapsulation layer; and
    a second inorganic encapsulation layer above the organic encapsulation layer, and
    a first portion of the first inorganic encapsulation layer and a first portion of the second inorganic encapsulation layer are in direct contact with each other on one of the plurality of protrusions of the first partition wall.

11. The display panel of claim 10, wherein a second portion of the first inorganic encapsulation layer and a second portion of the second inorganic encapsulation layer are in direct contact with each other on the second partition wall.

12. A display panel comprising:
    a substrate defining an opening therein;
    a plurality of light-emitting diodes in a display area surrounding the opening;
    an encapsulation layer on the plurality of light-emitting diodes, the encapsulation layer comprising at least one inorganic encapsulation layer and at least one organic encapsulation layer;
    a first partition wall and a second partition wall in a non-display area between the opening and the display area, the first partition wall and the second partition wall being arranged in a direction from the display area to the opening;
    a plurality of grooves defined above at least one inorganic insulating layer in the non-display area, the at least one inorganic insulating layer being on the substrate; and
    a metal dummy stack on opposite sides of a virtual vertical line passing through a center of each of the plurality of grooves,
    wherein the metal dummy stack comprises a plurality of metal layers stacked with an insulating layer therebetween,
    wherein at least one of the plurality of grooves is defined between the first partition wall and the second partition wall and is covered with the organic encapsulation layer.

13. A display panel comprising:
    a substrate defining an opening therein;
    a plurality of light-emitting diodes in a display area surrounding the opening, wherein one of the plurality of light-emitting diodes includes a first electrode, a second electrode, an emission layer between the first electrode and the second electrode;

an encapsulation layer on the plurality of light-emitting diodes, the encapsulation layer comprising an organic encapsulation layer, a first inorganic encapsulation layer below the organic encapsulation layer, and a second inorganic encapsulation layer above the organic encapsulation layer;

a plurality of grooves defined in a non-display area between the opening and the display area;

a plurality of lower layers each disposed below each of the plurality of grooves in the non-display area; and at least one organic layer interposed between the first electrode and the second electrode in the display area, wherein an upper surface of each of the plurality of lower layers corresponds to a bottom surface of each of the plurality of grooves, wherein the at least one organic layer extends to the non-display area and is disconnected by at least one of the plurality of grooves.

14. The display panel of claim 13, wherein each of the plurality of light-emitting diodes is connected to a sub-pixel circuit on the substrate, and the sub-pixel circuit comprises a thin-film transistor including a silicon-based semiconductor layer and a thin-film transistor including an oxide-based semiconductor layer.

15. The display panel of claim 14, wherein each of the plurality of lower layers includes a same material as a material of the oxide-based semiconductor layer.

16. The display panel of claim 13, further comprising a first partition wall and a second partition wall in the non-display area, wherein the first partition wall and the second partition wall are arranged in a direction from the display area to the opening.

17. The display panel of claim 16, wherein the first partition wall comprises a plurality of protrusions and a recess between adjacent protrusions, and a portion of the organic encapsulation layer is in the recess.

18. The display panel of claim 17, wherein a first portion of the first inorganic encapsulation layer and a first portion of the second inorganic encapsulation layer are in direct contact with each other on one of the plurality of protrusions of the first partition wall.

19. The display panel of claim 18, wherein a second portion of the first inorganic encapsulation layer and a second portion of the second inorganic encapsulation layer are in direct contact with each other on the second partition wall.

20. The display panel of claim 16, wherein at least one of the plurality of grooves is defined between the first partition wall and the second partition wall.

21. The display panel of claim 20, wherein the at least one groove between the first partition wall and the second partition wall is covered with the organic encapsulation layer.

22. The display panel of claim 16, wherein the plurality of grooves comprises two or more grooves between the first partition wall and the second partition wall, and a first groove adjacent to the first partition wall among the two or more grooves comprises a pair of tips protruding toward a center of the first groove.

23. The display panel of claim 22, wherein the second electrode extends to the non-display area and disconnected or separated by the pair of tips of the first groove in the non-display area.

24. The display panel of claim 23, wherein a second groove adjacent to the second partition wall among the two or more grooves does not comprise a tip on at least one of opposite sides of a virtual vertical line passing through a center of the second groove, and the functional layer and the second electrode continuously cover an inner surface of the groove on the at least one side of the second groove.

25. A display panel comprising:

a substrate defining an opening therein;

a plurality of light-emitting diodes in a display area surrounding the opening;

an encapsulation layer on the plurality of light-emitting diodes, the encapsulation layer comprising an organic encapsulation layer, a first inorganic encapsulation layer below the organic encapsulation layer, and a second inorganic encapsulation layer above the organic encapsulation layer;

a plurality of grooves defined in a non-display area between the opening and the display area;

a plurality of lower layers each disposed below each of the plurality of grooves in the non-display area; and a metal dummy stack on opposite sides of a virtual vertical line passing through a center of each of the plurality of grooves, wherein the metal dummy stack comprises a plurality of metal layers stacked with an insulating layer therebetween, wherein an upper surface of each of the plurality of lower layers corresponds to a bottom surface of each of the plurality of grooves.

\* \* \* \* \*